US012666824B2

(12) United States Patent
Bang et al.

(10) Patent No.: US 12,666,824 B2
(45) Date of Patent: Jun. 23, 2026

(54) DISPLAY APPARATUS

(71) Applicant: Samsung Display Co., Ltd., Yongin-si (KR)

(72) Inventors: Kiho Bang, Yongin-si (KR); Seunghwan Cho, Yongin-si (KR); Seongmin Wang, Yongin-si (KR); Jiwon Sohn, Yongin-si (KR); Wonsuk Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 573 days.

(21) Appl. No.: 18/193,125

(22) Filed: Mar. 30, 2023

(65) Prior Publication Data

US 2024/0107831 A1    Mar. 28, 2024

(30) Foreign Application Priority Data

Sep. 28, 2022    (KR) ........................ 10-2022-0123479

(51) Int. Cl.
*H10K 59/131* (2023.01)
(52) U.S. Cl.
CPC ................................. *H10K 59/131* (2023.02)
(58) Field of Classification Search
None
See application file for complete search history.

(56) References Cited

U.S. PATENT DOCUMENTS

| | | | |
|---|---|---|---|
| 2021/0265451 A1 | 8/2021 | Son et al. | |
| 2021/0351259 A1* | 11/2021 | Lee ...................... | H10K 59/131 |
| 2021/0375215 A1 | 12/2021 | Cho et al. | |
| 2021/0391405 A1 | 12/2021 | Lee et al. | |

FOREIGN PATENT DOCUMENTS

| | | |
|---|---|---|
| KR | 10-2021-0108542 | 9/2021 |
| KR | 10-2021-0137336 | 11/2021 |
| KR | 10-2021-0148547 | 12/2021 |
| KR | 10-2021-0155444 | 12/2021 |

* cited by examiner

*Primary Examiner* — Kyoung Lee
(74) *Attorney, Agent, or Firm* — F. CHAU & ASSOCIATES, LLC

(57)    ABSTRACT

A display apparatus includes a substrate including a display area and a peripheral area, a data line arranged in the display area and extending in a first direction, a first horizontal connection line connected to the data line in the display area and extending in a second direction intersecting the first direction, a first vertical connection line in the display area, extending in the first direction, and having an end electrically connected to the first horizontal connection line and another end disposed closer to the peripheral area than the end, and a second horizontal connection line in the display area, extending in the second direction, and having an end electrically connected to the another end of the first vertical connection line and another end disposed farther from the data line than the end.

20 Claims, 25 Drawing Sheets

DISPLAY APPARATUS

CROSS-REFERENCE TO RELATED APPLICATION(S)

This application claims priority to and benefits of Korean Patent Application No. 10-2022-0123479 under 35 U.S.C. § 119, filed on Sep. 28, 2022, in the Korean Intellectual Property Office (KIPO), the entire contents of which are incorporated herein by reference.

BACKGROUND

1. Technical Field

The disclosure relates to a display apparatus which may display high-quality images while having a reduced peripheral area.

2. Description of the Related Art

Generally, display apparatuses include a display area and a peripheral area, the display area being configured to display images, and the peripheral area being outside the display area. A portion of the display area in display apparatuses may be relatively increased by reducing the area of the peripheral area.

SUMMARY

In a display apparatus according to the related art, it has been studied to achieve high-quality images while having a reduced peripheral area.

One or more embodiments include a display apparatus which may display high-quality images while having a reduced peripheral area. However, such a technical problem is an example, and the disclosure is not limited thereto.

Additional aspects will be set forth in part in the description which follows and, in part, will be apparent from the description, or may be learned by practice of the presented embodiments of the disclosure.

According to an embodiment of the disclosure, a display apparatus may include a substrate including a display area and a peripheral area outside the display area, a data line arranged in the display area and extending in a first direction, a first horizontal connection line connected to the data line in the display area and extending in a second direction intersecting the first direction, a first vertical connection line arranged in the display area, extending in the first direction, and having an end electrically connected to the first horizontal connection line and another end disposed closer to the peripheral area than the end of the first vertical connection line electrically connected to the first horizontal connection line, and a second horizontal connection line arranged in the display area, extending in the second direction, and having an end electrically connected to the another end of the first vertical connection line and another end disposed farther from the data line than the end of the second horizontal connection line electrically connected to the another end of the first vertical connection line.

The display apparatus may further include a second vertical connection line having an end electrically connected to the another end of the second horizontal connection line and another end disposed such that the second horizontal connection line is disposed between the another end of the second vertical connection line and the first horizontal connection line.

The another end of the second vertical connection line may be disposed in the peripheral area.

The display apparatus may further include a second vertical connection line extending in the first direction and having an end electrically connected to the another end of the second horizontal connection line and another end disposed farther from the peripheral area than the end of the second vertical connection line electrically connected to the another end of the second horizontal connection line.

The display apparatus may further include a third horizontal connection line arranged in the display area, extending in the second direction, and having an end electrically connected to the another end of the second vertical connection line and another end disposed farther from the data line than the end of the third horizontal connection line electrically connected to the another end of the second vertical connection line.

The display apparatus may further include a third vertical connection line extending in the first direction and having an end electrically connected to the another end of the third horizontal connection line and another end disposed on a same side as the second horizontal connection line with respect to the third horizontal connection line.

The another end of the third vertical connection line may be disposed in the peripheral area.

The data line the first horizontal connection line may be disposed on different layers.

The first horizontal connection line and the second horizontal connection line may be disposed on a same layer.

The display apparatus may further include a plurality of scan lines extending in the second direction.

According to an embodiment of the disclosure, a display apparatus may include a substrate including a display area and a peripheral area outside the display area, a data line arranged in the display area and extending in a first direction, and a connection line having an end connected to the data line in the display area and another end disposed in the peripheral area, and including a plurality of horizontal connection lines extending in a second direction intersecting the first direction and a plurality of vertical connection lines extending in the first direction. A first length in the second direction of one of the plurality of horizontal connection lines and a second length in the second direction of another one of the plurality of horizontal connection lines may be different.

A distance in the first direction from a portion of the peripheral area in which the another end of the connection line is disposed to one of the plurality of horizontal connection lines that is connected to the data line may be greater than distances in the first direction from the portion of the peripheral area to others of the plurality of horizontal connection lines.

Distances in the first direction from a portion of the peripheral area in which the another end of the connection line is disposed to the plurality of horizontal connection lines may decrease toward a center of the display area in the second direction.

Lengths of the plurality of horizontal connection lines in the second direction may be randomly arranged.

The display area may include a plurality of pixel areas, the first length may correspond to a width of one of the plurality of pixel areas in the second direction, n may be a natural number greater than 1 and, the second length may be n times the first length.

n may be greater than or equal to 2.

The plurality of horizontal connection lines may include a first horizontal connection line having the first length and a second horizontal connection line having the second length alternatively arranged in the second direction.

The plurality of vertical connection lines may electrically connect the plurality of horizontal connection lines.

The data line may be disposed on a layer which is different from a layer on which the plurality of horizontal connection lines are disposed.

The display apparatus may further include a plurality of scan lines extending in the second direction.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
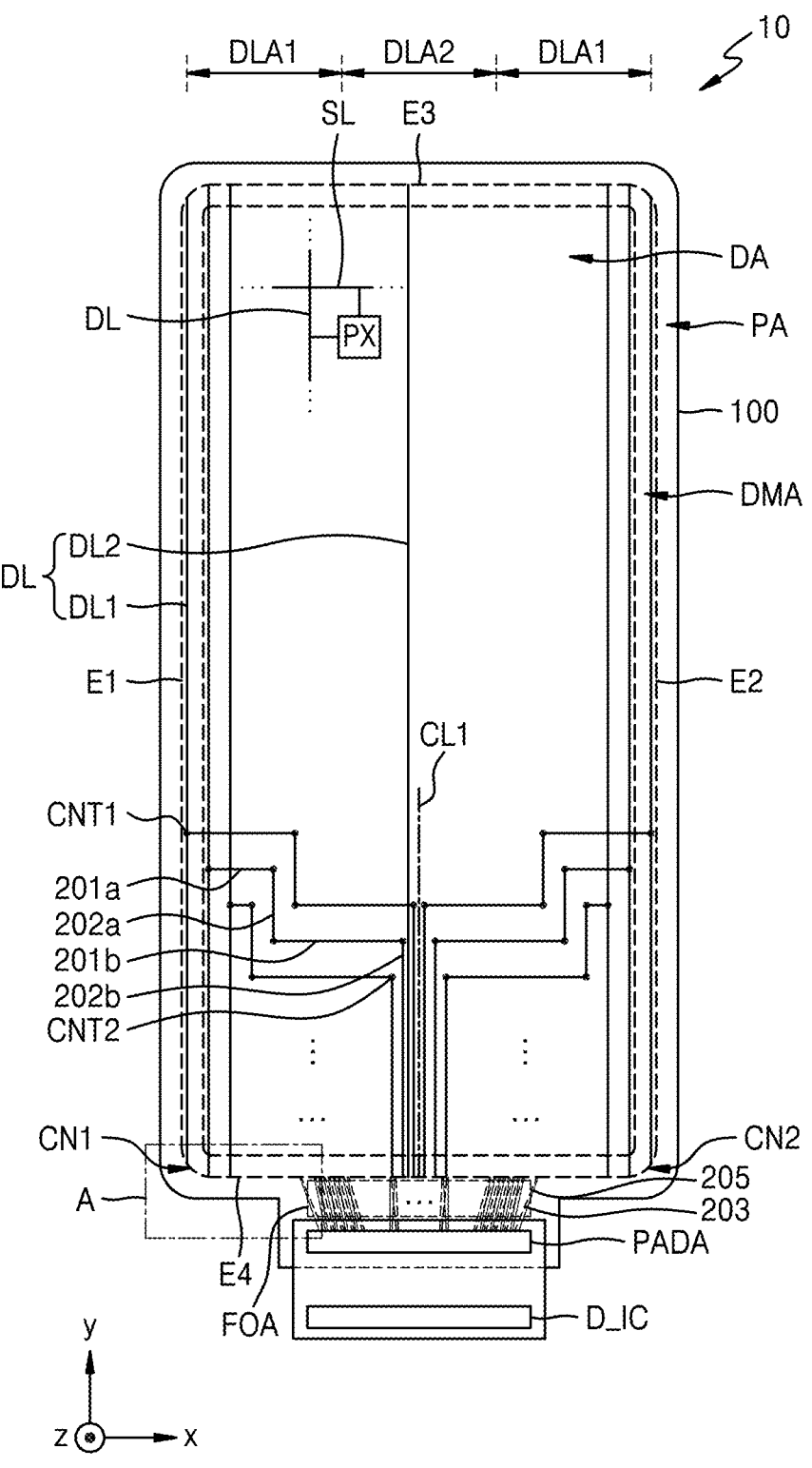
FIG. 1 is a schematic plan view of a display panel of a display apparatus according to an embodiment.

Reference will now be made in detail to embodiments, embodiments of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. In the specification and the claims, the term "and/or" is intended to include any combination of the terms "and" and "of" for the purpose of its meaning and interpretation. For example, "A and/or B" may be understood to mean "A, B, or A and B."

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

In addition, sizes of elements in the drawings may be exaggerated or reduced for convenience of explanation. For example, the size and thickness of each element shown in the drawings are arbitrarily represented for convenience of description, and thus, the disclosure is not necessarily limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings, wherein like reference numerals refer to like elements throughout and a repeated description thereof is omitted.

Figure 2:
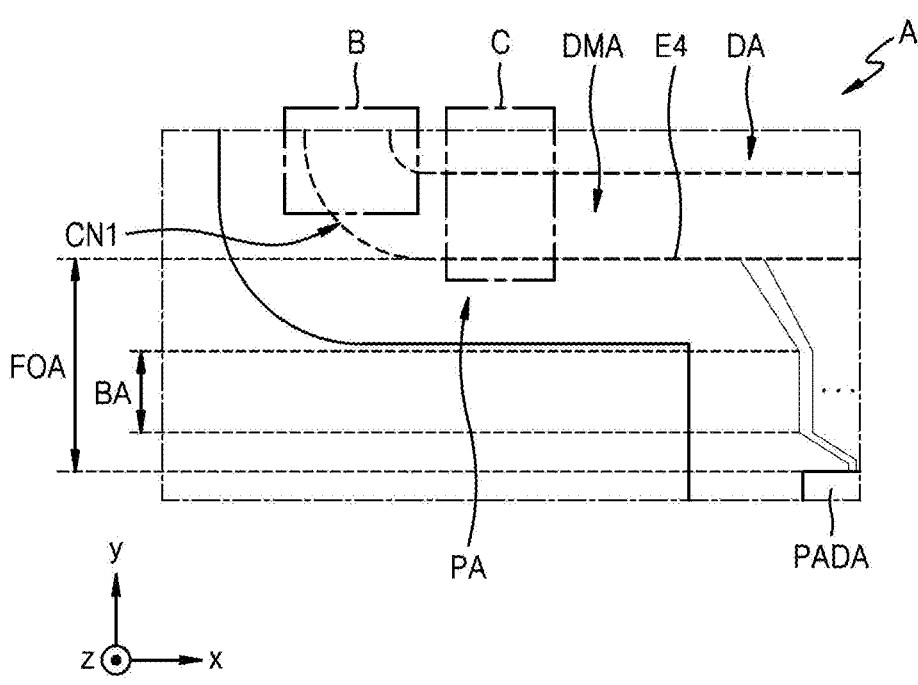
FIG. 2 is a schematic plan view of region A of FIG. 1.
Figure 3:
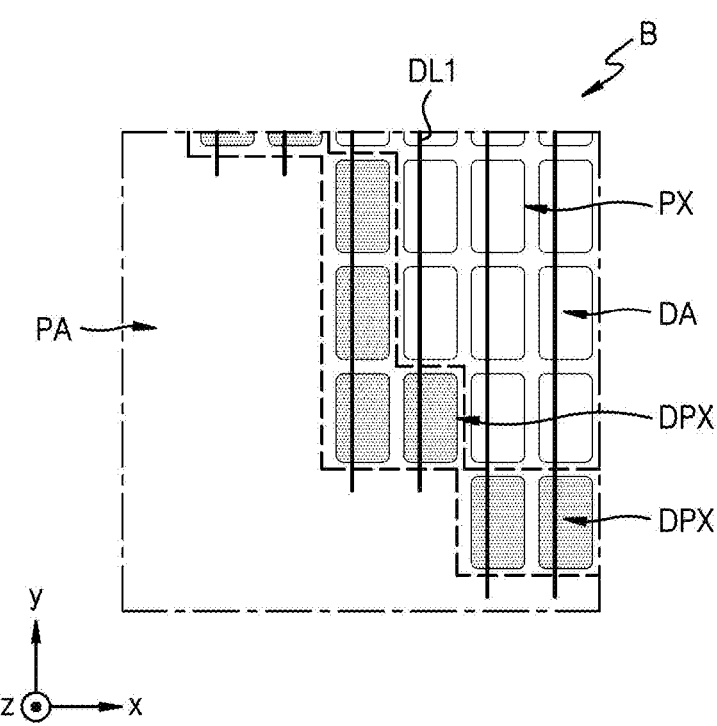
FIG. 3 is a schematic plan view of region B of FIG. 2.
Figure 4:
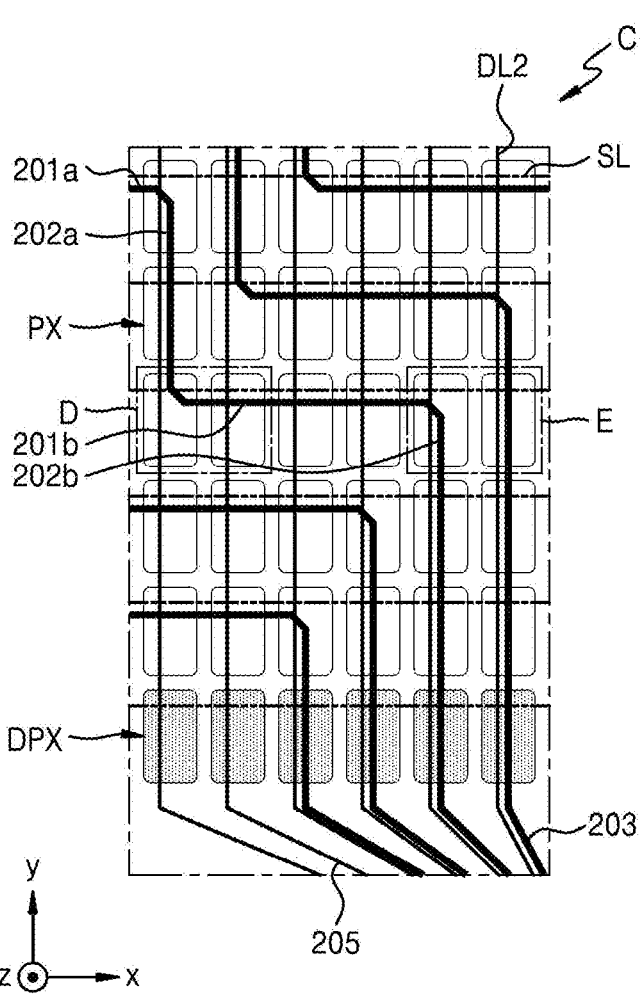
FIG. 4 is a schematic plan view of region C of FIG. 2.

FIG. 1 is a schematic plan view of a display panel 10 of a display apparatus according to an embodiment, FIG. 2 is a schematic plan view of region A of FIG. 1, FIG. 3 is a schematic plan view of region B of FIG. 2, and FIG. 4 is a schematic plan view of region C of FIG. 2.

Referring to FIG. 1, the display panel 10 of the display apparatus according to an embodiment may include a display area DA and a peripheral area PA. The display area DA may display images, and the peripheral area PA may be disposed outside the display area DA to be adjacent to the display area DA. A substrate 100 of the display panel 10 may also include the display area DA and the peripheral area PA.

The substrate 100 may include a glass, a metal, or a polymer resin. In case that the substrate 100 is flexible or bendable, the substrate 100 may include, for example, a polymer resin including polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers including a polymer resin, and a barrier layer including an inorganic material (such as silicon oxide, silicon nitride, and silicon oxynitride) therebetween. However, the disclosure is not limited thereto.

The display area DA may have an overall shape that is the same as or similar to a rectangle or a square in a plan view. The corner of the display area DA may have a round shape. It is shown in FIGS. 1 and 2 that a first corner CN1 of the edge of the display area DA has a round shape.

For example, the display area DA may include a first edge E1, a second edge E2, a third edge E3, and a fourth edge E4, the first edge E1 and the second edge E2 facing each other, and the third edge E3 and the fourth edge E4 being between the first edge E1 and the second edge E2 and facing each other. A pad area PADA located in the peripheral area PA may be located adjacent to the fourth edge E4 among the first to fourth edges E1, E2, E3, and E4. The first corner CN1 having the round shape may connect the first edge E1 to the fourth edge E4. In the display area DA, a second corner CN2 may have a round shape similar to the first corner CN1. The second corner CN2 may connect the second edge E2 to the fourth edge E4. As shown in FIGS. 1 and 2, the display area DA may have a round shape in other corners.

Multiple pixels PX and wirings configured to apply electrical signals to the pixels PX may be located in the display area DA.

The pixels PX may each include a display element and a pixel circuit configured to drive the display element. The display element may be an organic light-emitting element, and the pixel circuit may include multiple transistors, a capacitor, and the like.

Signal lines configured to apply electrical signals to the of pixels PX may include multiple data lines DL, multiple scan lines SL, and the like. The data lines DL may each extend in a first direction (a y-axis direction), and the scan lines SL may each extend in a second direction (an x-axis direction) crossing the first direction. The data lines DL may apply data signals to the pixels PX, and the scan lines SL may apply scan signals to the pixels PX. The pixels PX may each be connected to a corresponding data line DL among the data lines DL and to a corresponding scan line SL among the scan lines SL.

The data lines DL may include first data lines DL1 and second data lines DL2. The first data lines DL1 may be located closer to the first edge E1 or the second edge E2 than the second data lines DL2. It is shown in FIG. 1 that a second data line arrangement area DLA2 having a shape extending in the first direction (the y-axis direction) is approximately located in the center of the display area DA, and first data line arrangement areas DLA1 are located on two opposite sides of the second data line arrangement area DLA2. A method by which the first data lines DL1 are connected to a pad in the pad area PADA may be different from a method by which the second data lines DL2 are connected to a pad in the pad area PADA. This is described below.

The peripheral area PA may surround the display area DA. The peripheral area PA may be a region in which the pixels PX are not arranged. The peripheral area PA may include the pad area PADA to which various electronic elements, a printed circuit board or the like are electrically attached, and a voltage line and the like configured to supply power for driving the display element may be arranged in the peripheral area PA. Multiple pads in the pad area PADA may be electrically connected to a printed circuit board on which a driving driver D_IC is disposed. FIG. 1 shows a chip-on-film (COF) type in which the driving driver D_IC is disposed on the printed circuit board electrically connected to the pads on the substrate 100. However, the embodiment is not limited thereto. For example, the driving driver D_IC may be directly disposed on the substrate 100 by using a chip-on-glass (COG) method or a chip-on-plastic (COP) method.

As shown in FIG. 2, the peripheral area PA may include a bent area BA. The bent area BA may be located between the pad area PADA and the display area DA. The substrate 100 may be bent in the bent area BA and at least a portion of the pad area PADA may overlap the display area DA in a plan view. A bending direction may be set such that the pad area PADA does not interfere the display area DA and is located behind the display area DA. Accordingly, an area of the peripheral area PA recognized by users may be reduced, and thus, the pad area PADA may make users recognize that the display area DA occupies most of the display panel 10.

FIG. 3 is a schematic plan view of region B of FIG. 2 and shows a portion of the first corner CN1. As shown in FIGS. 1 and 2, in case that users using the display apparatus according to an embodiment or an electronic apparatus including the same observe in a normal use environment, the first corner CN1 may be recognized to have a round shape, for example, a curved shape. However, in case that the first corner CN1 is enlarged and wirings having a width of several micrometers or tens of micrometers is observed, as shown in FIG. 3, the first corner CN1 may be shown to have a straight line shape bent multiple times in the first direction (the y-axis direction) and the second direction (the x-axis direction). Although the first corner CNT is shown to have a straight line shape bent multiple times as shown in FIG. 3 in case that the first corner CN1 is enlarged, because the first corner CN1 is recognized to have a round shape, for example, a curved shape in a normal use environment, hereinafter, the first corner CN1 is described to have a round shape.

The display area DA may include a dummy area DMA. The dummy area DMA may be located along the first edge E1, the second edge E2, the third edge E3, the fourth edge E4, the first corner CN1, and the second corner CN2 of the display area DA, and be located adjacent to the peripheral area PA. Multiple dummy pixels DPX may be arranged in the dummy area DMA. The dummy pixels DPX may surround the pixels PX and be located adjacent to the peripheral area PA. For convenience of description, FIG. 3 shows only some of the pixels PX and some of the dummy pixels DPX in the display area DA. In another embodiment, the display area DA may not include the dummy area DMA, and the pixels PX may be also located in a portion adjacent to the peripheral area PA.

Connection lines may be disposed on the substrate 100 and may transfer electrical signals supplied from the pads to the signal lines connected to the pixels PX. For example, the signal lines may include the data lines DL, and the connection lines may transfer data signals from the pads of the pad area PADA to the data lines DL.

The connection lines may include first connection line 201a, 201b, 202a, and 202b, a second connection line 203, and a third connection line 205. Most of the first connection line 201a, 201b, 202a, and 202b may be located in the display area DA, and the second connection line 203 and the third connection line 205 may be located in the peripheral area PA. Some of the first connection line 201a, 201b, 202a, and 202b may be located in the dummy area DMA. The second connection lines 203 and the third connection lines 205 may be located in a fan-out area FOA in the peripheral area PA. The fan-out area FOA may be located between the pad area PADA and the display area DA.

The first connection line 201a, 201b, 202a, and 202b arranged on the left of a first central line CL1 passing through the center of the display panel 10 may be approximately symmetrical to the first connection line 201a, 201b, 202a, and 202b arranged on the right of the first central line CL1 with respect to the first central line CL1.

At least a portion of the first connection line 201a, 201b, 202a, and 202b may be disposed on a layer different from a layer or layers on which the scan lines SL and the data lines DL of the pixel PX are disposed. The first connection line 201a, 201b, 202a, and 202b may include a first horizontal connection line 201a and a second horizontal connection line 201b extending in the second direction (the x-axis direction) and a first vertical connection line 202a and a second vertical connection line 202b extending in the first direction (the y-axis direction).

The first horizontal connection line 201a may be located in the display area DA and may extend in the second direction (the x-axis direction) in parallel to the scan line SL. An end (in a −x direction) of the first horizontal connection line 201a may be connected to the first data line DL1 in the display area DA. The first horizontal connection line 201a and the first data line DL1 may be disposed on different layers. Accordingly, the first horizontal connection line 201a may be electrically connected to the first data line DL1 through a first contact hole CNT1 formed in an insulating layer therebetween.

The first vertical connection line 202a may be located in the display area DA and may extend in the first direction (the y-axis direction) parallel to the first data line DL1. An end (in a +y direction) of the first vertical connection line 202a may be electrically connected to another end (in a +x direction) of the first horizontal connection line 201a. The first vertical connection line 202a and the first horizontal connection line 201a may be disposed on different layers. Accordingly, the first vertical connection line 202a may be electrically connected to the first horizontal connection line 201a through a second contact hole CNT2 formed in an insulating layer therebetween. Another end (in the −y direction) of the first vertical connection line 202a may be located closer to the peripheral area PA than the end (in the +y direction). For example, the another end (in the −y direction) of the first vertical connection line 202a may be located closer to the pad area PADA than the end (in the +y direction).

The second horizontal connection line 201b may be located in the display area DA and may extend in the second direction (the x-axis direction) parallel to the scan line SL. An end (in the −x direction) of the second horizontal connection line 201b may be connected to the another end (in the −y direction) of the first vertical connection line 202a. The second horizontal connection line 201b and the first vertical connection line 202a may be disposed on different layers. Accordingly, the second horizontal connection line 201b may be electrically connected to the first vertical connection line 202a through the second contact hole CNT2 formed in an insulating layer therebetween. Another end (in the +x direction) of the second horizontal connection line 201b may be positioned farther away from the first data line DL1 than the end (in the −x direction). The second horizontal connection line 201b and the first horizontal connection line 201a may be disposed on a same layer.

The second vertical connection line 202b may extend in the first direction (the y-axis direction) parallel to the first data line DL1. An end (in the +y direction) of the second vertical connection line 202b may be electrically connected to the another end (in the +x direction) of the second horizontal connection line 201b. The second vertical connection line 202b and the second horizontal connection line 201b may be disposed on different layers. Accordingly, the second vertical connection line 202b may be electrically connected to the second horizontal connection line 201b through a second contact hole CNT2 formed in an insulating layer therebetween. The second vertical connection line 202b and the first vertical connection line 202a may be disposed on a same layer. Another end (in the −y direction) of the second vertical connection line 202b may be positioned in a direction (the −y direction) opposite to the direction to the first horizontal connection line 201a with respect to the second horizontal connection line 201b. In other words, the second horizontal connection line 201b may be disposed between the another end of the second vertical connection line 202b and the first horizontal connection line 201a. For example, the another end (in the −y direction) of the second vertical connection line 202b may be located in the peripheral area PA as shown in FIGS. 1 and 4. Accordingly, as shown in FIG. 1, the first connection line 201a, 201b, 202a, and 202b may have a shape indented once in a plan view.

For example, the first horizontal connection line 201a and the second horizontal connection line 201b may include a same material and be disposed on a same layer, and the first vertical connection line 202a and the second vertical connection line 202b may include a same material and be disposed on a same layer.

In case that the another end (in the −y direction) of the second vertical connection line 202b is located in the peripheral area PA as shown in FIGS. 1 and 4, the second vertical connection line 202b may be connected to an end (in the +y direction) of the second connection line 203 in the peripheral area PA. In an embodiment, the second connection line 203 and the second vertical connection line 202b may be integral with each other. In case that the second connection line 203 and the second vertical connection line 202b are disposed on different layers, the second connection line 203 may be electrically connected to the second vertical connection line 202b through a contact hole. Another end (in the −y direction) of the second connection line 203 may be connected to the pad in the pad area PADA. In an embodiment, the second connection line 203 and the pad may be integral with each other.

An end (in the +y direction) of the third connection line 205 located in the peripheral area PA may be connected to the second data line DL2. Another end (in the −y direction) of the third connection line 205 may be connected to the pad in the pad area PADA. In an embodiment, the third connection line 205 and the pad may be integral with each other.

As described above, the data lines DL may include the first data lines DL1 and the second data lines DL2. The first data lines DL1 may be respectively electrically connected to corresponding pads through the first connection line 201a, 201b, 202a, and 202b, and the second connection line 203, and the second data lines DL2 may be respectively electrically connected to corresponding pads through the third connection line 205. For example, the second connection line 203 and the third connection line 205 may include a same material and be disposed on a same layer.

Through this configuration, in case that the first data lines DL1 located in the first data line arrangement area DLA1 are electrically connected to the corresponding second connection line 203, the first data lines DL1 may be electrically connected to the second connection line 203 through the first connection lines 201*a*, 201*b*, 202*a*, 202*b* passing across the display area DA without passing across the peripheral area PA. As a result, because an area of the peripheral area PA corresponding to at least a portion of the first data line arrangement area DLA1 is reduced, the width in the second direction (the x-axis direction) of region A of the substrate 100 may be reduced as shown in FIGS. 1 and 2. The substrate 100 may be readily bent in the bent area BA by reducing the width of the substrate 100.

For example, the second data lines DL2 located in the second data line arrangement area DLA2 may be directly connected to the third connection line 205. This is because the second data lines DL2 are not located adjacent to the first edge E1 or the second edge E2 of the display area DA.

Figure 5:
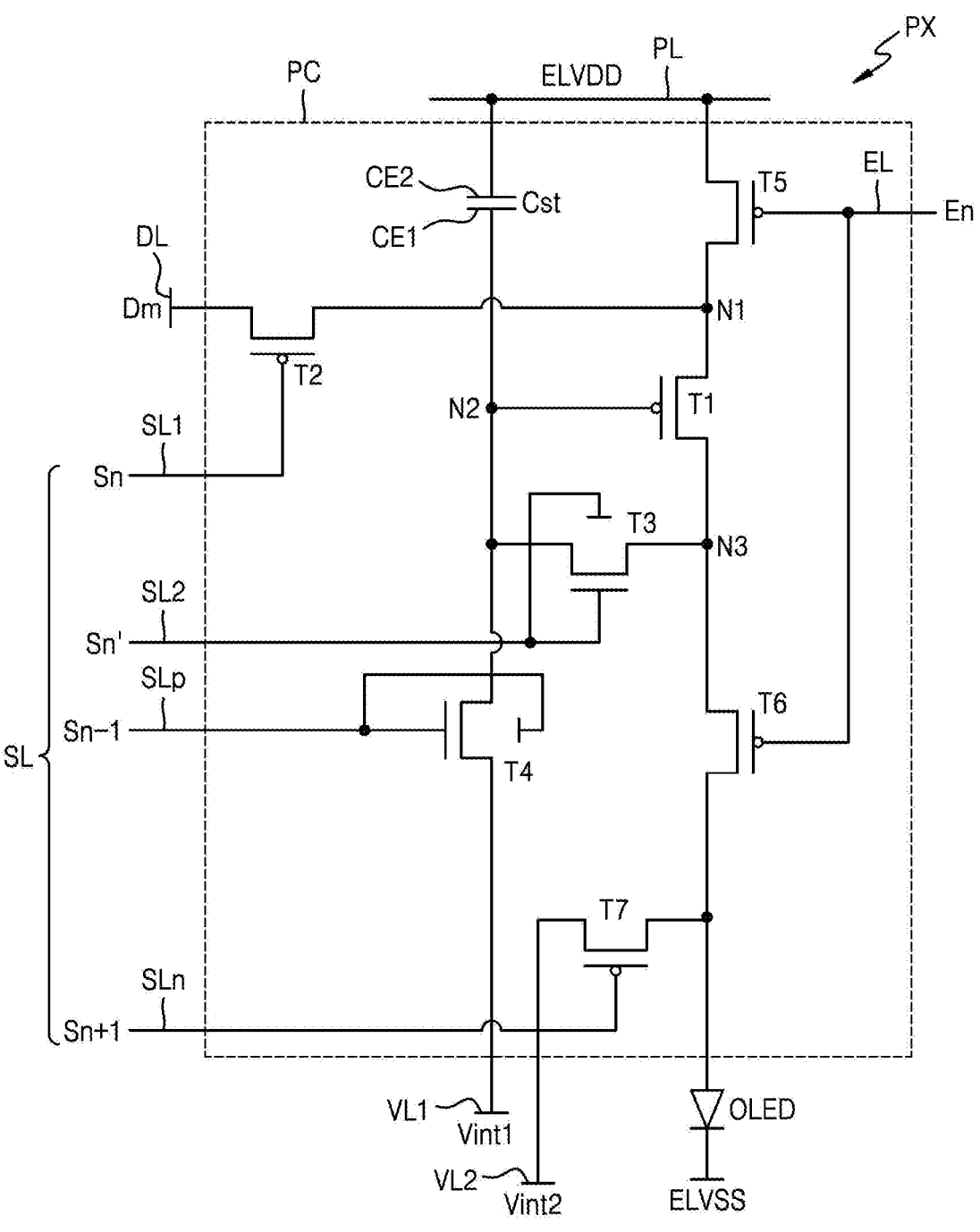
FIG. 5 is a schematic diagram of an equivalent circuit of a pixel of the display panel of FIG. 1.

FIG. 5 is a schematic diagram of an equivalent circuit of a pixel PX of the display panel 10 of FIG. 1.

As shown in FIG. 5, a pixel PX may include a pixel circuit PC and an organic light-emitting diode OLED electrically connected to the pixel circuit PC.

As shown in FIG. 5, the pixel circuit PC may include multiple thin-film transistors T1, T2, T3, T4, T5, T6, and T7, and a storage capacitor Cst. The thin-film transistors T1, T2, T3, T4, T5, T6, and T7, and the storage capacitor Cst may be connected to a first initialization voltage line VL1, a second initialization voltage line VL2, and the driving voltage line PL. At least one of the lines, for example, the driving voltage line PL may be shared by adjacent pixels PX.

The thin-film transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a pixel electrode and an opposite electrode. The pixel electrode of the organic light-emitting diode OLED may be connected to the driving transistor T1 through the emission control transistor T6 and may receive a driving current, and the opposite electrode may receive a second power voltage ELVSS. The organic light-emitting diode OLED may generate light of a brightness corresponding to the driving current.

Some of the thin-film transistors T1, T2, T3, T4, T5, T6, and T7 may be n-channel metal oxide semiconductor (NMOS) field-effect transistors (n-channel MOSFETs), and the rest may be p-channel metal oxide semiconductor (PMOS) field-effect transistors (p-channel MOSFETs). For example, among the thin-film transistors T1, T2, T3, T4, T5, T6, and T7, the compensation transistor T3 and the first initialization transistor T4 may be n-channel MOSFETs (NMOS), and the rest may be p-channel MOSFETs (PMOS). In another embodiment, among the thin-film transistors T1, T2, T3, T4, T5, T6, and 17, the compensation transistor T3, the first initialization transistor T4, and the second initialization transistor T7 may be n-channel MOSFETs (NMOSs), and the rest may be p-channel MOSFETs (PMOSs). In another embodiment, all of the thin-film transistors T1, T2, T3, T4, T5, T6, and T7 may be NMOSs or PMOSs. The thin-film transistors T1, T2, T3, T4, T5, T6, and T7 may each include an amorphous silicon or a polycrystalline silicon. A thin-film transistor, which is an NMOS, may include an oxide semiconductor. Hereinafter, for convenience of description, the case where the compensation transistor T3 and the first initialization transistor T4 are NMOSs including an oxide semiconductor, and the rest are PMOSs, is described.

The signal lines may include a first scan line SL1, a second scan line SL2, a previous scan line SLp, a next scan line SLn, an emission control line EL, and the data line DL. The first scan line SL1 may transfer a first scan signal Sn, the second scan line SL2 may transfer a second scan signal Sn', the previous scan line SLp may transfer a previous scan signal Sn−1 to the first initialization transistor T4, the next scan line SLn may transfer a next scan signal Sn+1 to the second initialization transistor T7, the emission control line EL may transfer an emission control signal En to the operation control transistor T5 and the emission control transistor T6, and the data line DL crossing the first scan line SL1 may transfer a data signal Dm.

The driving voltage line PL may transfer a driving voltage ELVDD to the driving transistor T1, the first initialization voltage line VL1 may transfer a first initialization voltage Vint1 initializing the driving transistor T1, and the second initialization voltage line VL2 may transfer a second initialization voltage Vint2 initializing the pixel electrode of the organic light-emitting diode OLED.

A driving gate electrode of the driving transistor T1 may be connected to the storage capacitor Cst through a second node N2, one of a source region and a drain region of the driving transistor T1 may be connected to a driving voltage line PL through the operation control transistor T5 via a first node N1, and another one of the source region and the drain region of the driving transistor T1 may be connected to the first electrode (e.g., a pixel electrode) of the organic light-emitting diode OILED through the emission control transistor T6 via a third node N3. The driving transistor T1 may receive a data signal Dm and supply the driving current to the organic light-emitting diode OLED according to a switching operation of the switching transistor T2. For example, the driving transistor T1 may control the amount of current flowing from the first node N1 to the organic light-emitting diode OLED in response to a voltage applied to the second node N2 changed by a data signal Dm, the first node N1 being electrically connected to the driving voltage line PL.

A switching gate electrode of the switching transistor T2 may be connected to the first scan line SL1 that transfers a first scan signal Sn, one of a source region and a drain region of the switching transistor T2 may be connected to the data line DL, and another one of the source region and the drain region of the switching transistor T2 may be connected to the driving transistor T1 through the first node N1, and connected to the driving voltage line PL through the operation control transistor T5. The switching transistor T2 may transfer a data signal Dm from the data line DL to the first node N1 in response to a voltage applied to the first scan line SL1. For example, the switching transistor T2 may perform a switching operation according to a first scan signal Sn transferred through the first scan line SL1 and transfer a data signal Dm to the driving transistor T1 through the first node N1, the data signal Din being transferred through the data line DL.

A compensation gate electrode of the compensation transistor T3 may be connected to the second scan line SL2. One of a source region and a drain region of the compensation transistor T3 may be connected to the first electrode of the organic light-emitting diode OLED through the emission control transistor T6 via the third node N3. Another one of the source region and the drain region of the compensation transistor T3 may be connected to a first capacitor electrode CE1 of the storage capacitor Cst, and the driving gate electrode of the driving transistor T1 through the second node N2. The compensation transistor T3 may diode-connect the driving transistor T1 by being turned on according to a second scan signal Sn' received through the second scan line SL2.

A first initialization gate electrode of the first initialization transistor T4 may be connected to the previous scan line SLp. One of a source region and a drain region of the first initialization transistor T4 may be connected to the first initialization voltage line VL1. Another one of the source region and the drain region of the first initialization transistor T4 may be connected to the first capacitor electrode CE1 of the storage capacitor Cst, and the driving gate electrode of the driving transistor T1 through the second node N2. The first initialization transistor T4 may apply the first initialization voltage Vint1 from the first initialization voltage line VL1 to the second node N2 according to a voltage applied to the previous scan line SLp. For example, the first initialization transistor T4 may be turned on according to a previous scan signal Sn−1 received through the previous scan line SLp and may perform an initialization operation of initializing the voltage of the driving gate voltage of the driving transistor T1 by transferring the first initialization voltage Vint1 to the driving gate electrode of the driving transistor T1.

An operation control gate electrode of the operation control transistor T5 may be connected to the emission control line EL, one of a source region and a drain region of the operation control transistor T5 may be connected to the driving voltage line PL, and another one of the source region and the drain region of the operation control transistor T5 may be connected to the driving transistor T1 and the switching transistor T2 through the first node N1.

An emission control gate electrode of the emission control transistor T6 may be connected to the emission control line EL, one of a source region and a drain region of the emission control transistor T6 may be connected to the driving transistor T1 and the compensation transistor T3 through the third node N3, and another one of the source region and the drain region of the emission control transistor T6 may be electrically connected to the first electrode (e.g., the pixel electrode) of the organic light-emitting diode OLED.

The operation control transistor T5 and the emission control transistor T6 may be simultaneously turned on according to an emission control signal En transferred through the emission control line EL, the driving voltage ELVDD may be transferred to the organic light-emitting diode OLED, and the driving current may flow through the organic light-emitting diode OLED.

A second initialization gate electrode of the second initialization transistor T7 may be connected to the next scan line SLn, one of a source region and a drain region of the second initialization transistor T7 may be connected to the first electrode (pixel electrode) of the organic light-emitting diode OLED, and another one of the source region and the drain region of the second initialization transistor T7 may be electrically connected to the second initialization voltage line VL2 to receive the second initialization voltage Vint2. The second initialization transistor T7 may be turned on according to a next scan signal Sn+1 transferred through the next scan line SLn and may initialize the first electrode (e.g., the pixel electrode) of the organic light-emitting diode OLED. The next scan line SLn and the first scan line SL1 may be the same, and the relevant scan line may transfer a same electric signal with a time difference, and thus, may serve as the first scan line SL1 and the next scan line SLn. For example, the next scan line SLn may be a first scan line of a pixel PX electrically connected to the data line DL and adjacent to the pixel PX shown in FIG. 5.

As shown in FIG. 5, the second initialization transistor T7 may be connected to the next scan line SLn. However, the embodiment is not limited thereto and the second initialization transistor T7 may be connected to the emission control line EL and thus driven according to an emission control signal En.

The storage capacitor Cst may include the first capacitor electrode CE1 and a second capacitor electrode CE2. The first capacitor electrode CE1 of the storage capacitor Cst may be connected to the driving gate electrode of the driving transistor T1 through the second node N2, and the second capacitor electrode CE2 of the storage capacitor Cst may be connected to the driving voltage line PL. The storage capacitor Cst may store charge corresponding to a difference between a voltage of the driving gate electrode of the driving transistor T1 and the driving voltage ELVDD.

A specific operation of each pixel PX according to an embodiment is described below.

In case that a previous scan signal Sn−1 is supplied through the previous scan line SLp during an initialization period, the first initialization transistor T4 may be turned on according to the previous scan signal Sn−1, and the driving transistor T1 may be initialized by the first initialization voltage Vint1 supplied from the first initialization voltage line VL1.

In case that a first scan signal Sn and a second scan signal Sn' are supplied through the first scan line SL1 and the second scan line SL2 during a data programming period, the switching transistor T2 and the compensation transistor T3 may be turned on according to the first scan signal Sn and the second scan signal Sn'. The driving transistor T1 may be diode-connected and forward-biased by the compensation transistor T3 that is turned on. A compensation voltage Dm+Vth, which is a voltage reduced by a threshold voltage Vth (Vth has a −value) of the driving transistor T1 from a data signal Dm supplied from the data line DL, may be applied to the driving gate electrode of the driving transistor T1. The driving voltage ELVDD and the compensation voltage Dm+Vth may be respectively applied to two opposite ends of the storage capacitor Cst, and charge corresponding to a difference between voltages of the two opposite ends may be stored in the storage capacitor Cst.

During an emission period, the operation control transistor T5 and the emission control transistor T6 may be turned on according to an emission control signal En supplied from the emission control line EL. The driving current corresponding to a voltage difference between the voltage of the driving gate electrode of the driving transistor T1 and the driving voltage ELVDD may be created, and the driving current may be supplied to the organic light-emitting diode OLED through the emission control transistor T6.

As described above, some of the thin-film transistors T1, T2, T3, T4, T5, T6, and T7 may include an oxide semiconductor. For example, the compensation transistor T3 and the first initialization transistor T4 may include an oxide semiconductor.

Because polycrystalline silicon has high reliability, intended current may be accurately controlled to flow. Accordingly, the driving transistor T1 directly influencing the brightness of the display apparatus may include a semiconductor layer including polycrystalline silicon having high reliability, and thus, a high-resolution display apparatus may be implemented. Because an oxide semiconductor has high carrier mobility and a low leakage current, a voltage drop may be not large even in case that a driving time is long. For example, because a color change of an image according to a voltage drop is not large even while the display apparatus including an oxide semiconductor is driven in low frequencies, the display apparatus may be driven in low frequencies. Accordingly, the compensation transistor T3 and the first initialization transistor T4 may include an oxide semiconductor to prevent a leakage current from occurring, and simultaneously, a display apparatus with reduced power consumption may be implemented.

Because the oxide semiconductor is sensitive to light, external light may change in the amount of current may. Accordingly, a metal layer may be located under the oxide semiconductor to absorb or reflect external light. Accordingly, as shown in FIG. 5, the compensation transistor T3 and the first initialization transistor T4 including an oxide semiconductor may each include gate electrodes respectively disposed over and below the oxide semiconductor layer. For example, a metal layer disposed below the oxide semiconductor may overlap the oxide semiconductor in a plan view.

Figure 6:
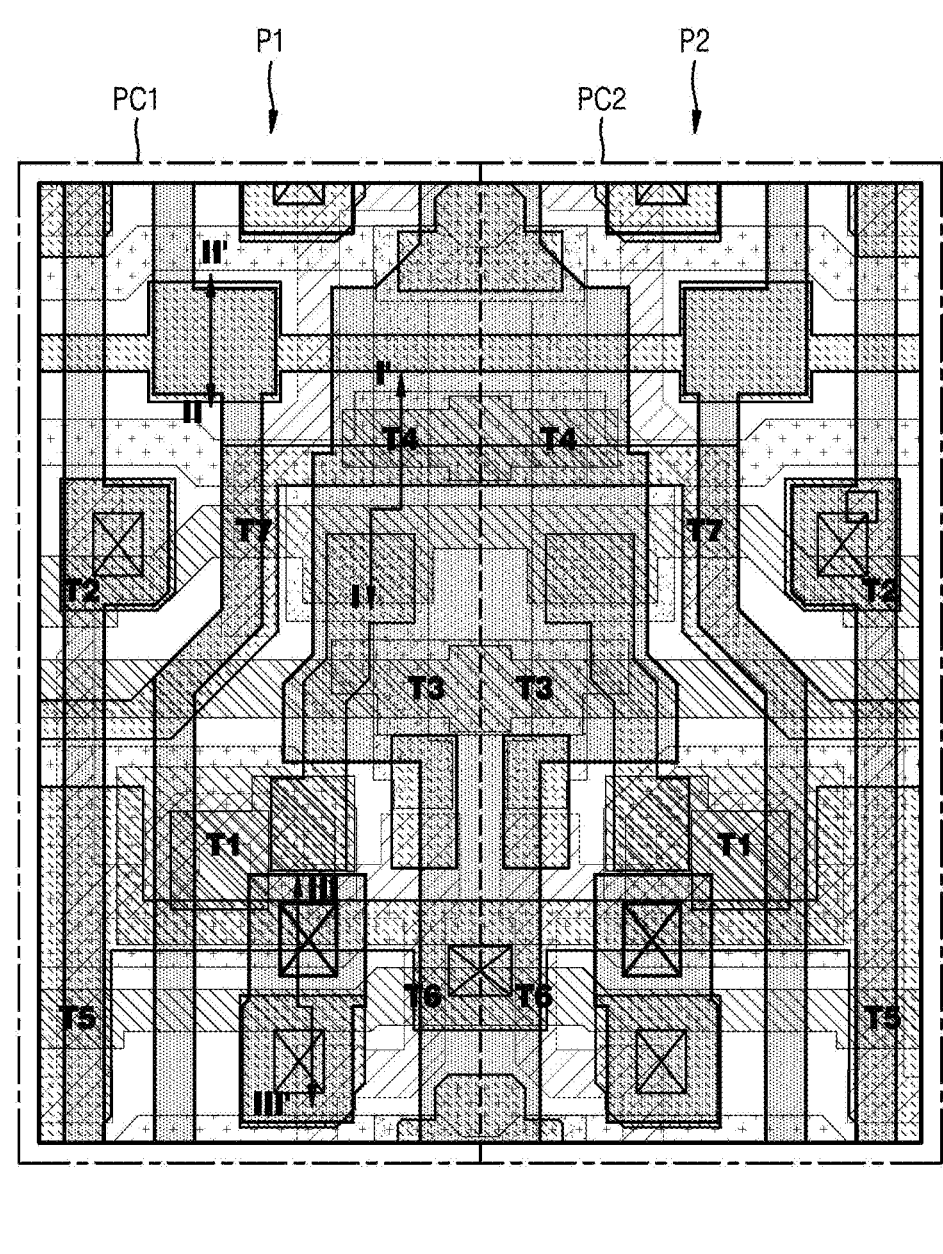
FIG. 6 is a schematic plan view showing positions of transistors, capacitors, and the like in pixels included in a display panel according to an embodiment.
Figure 6:
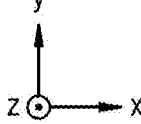
Figure 12:
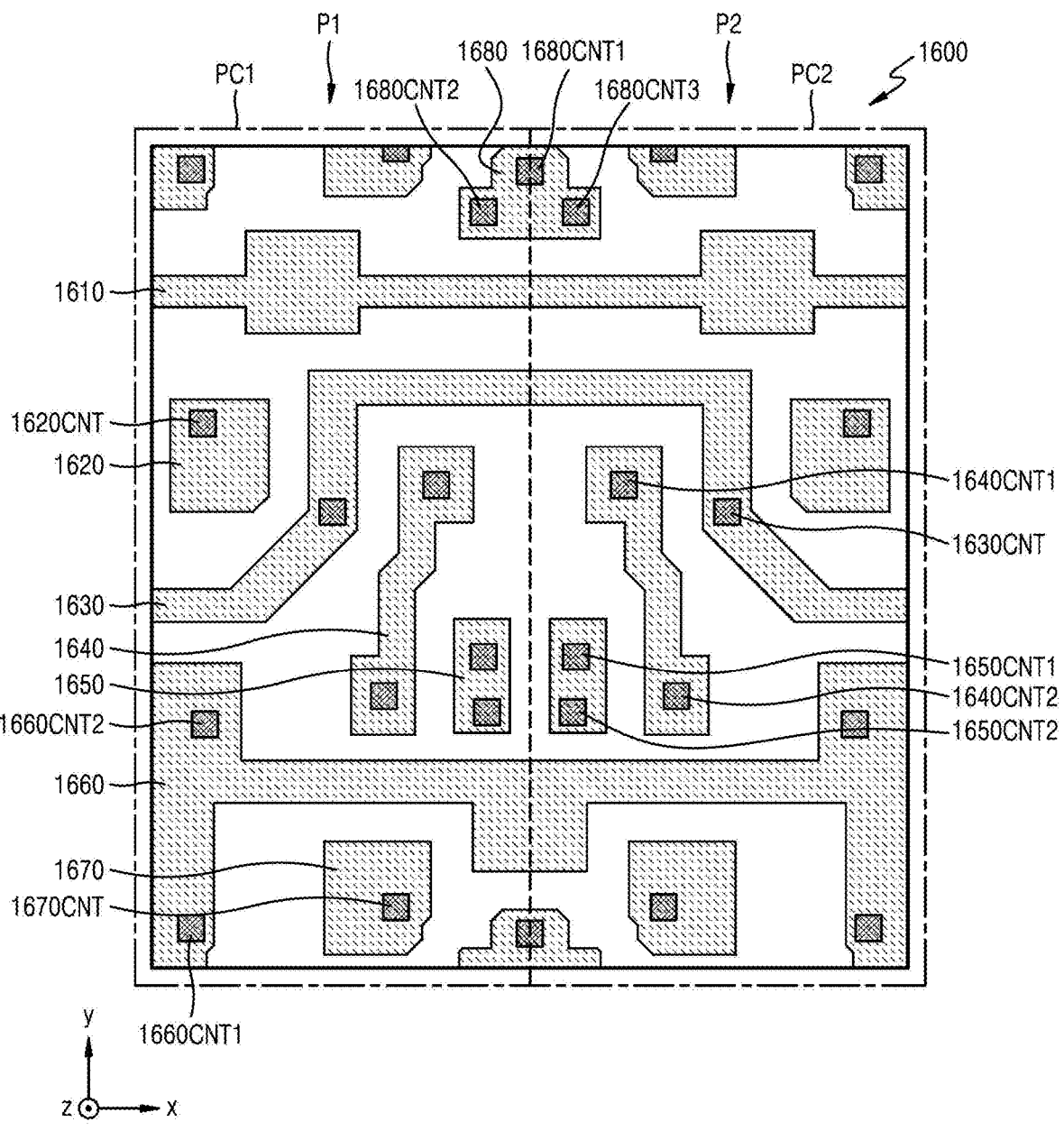
Figure 13:
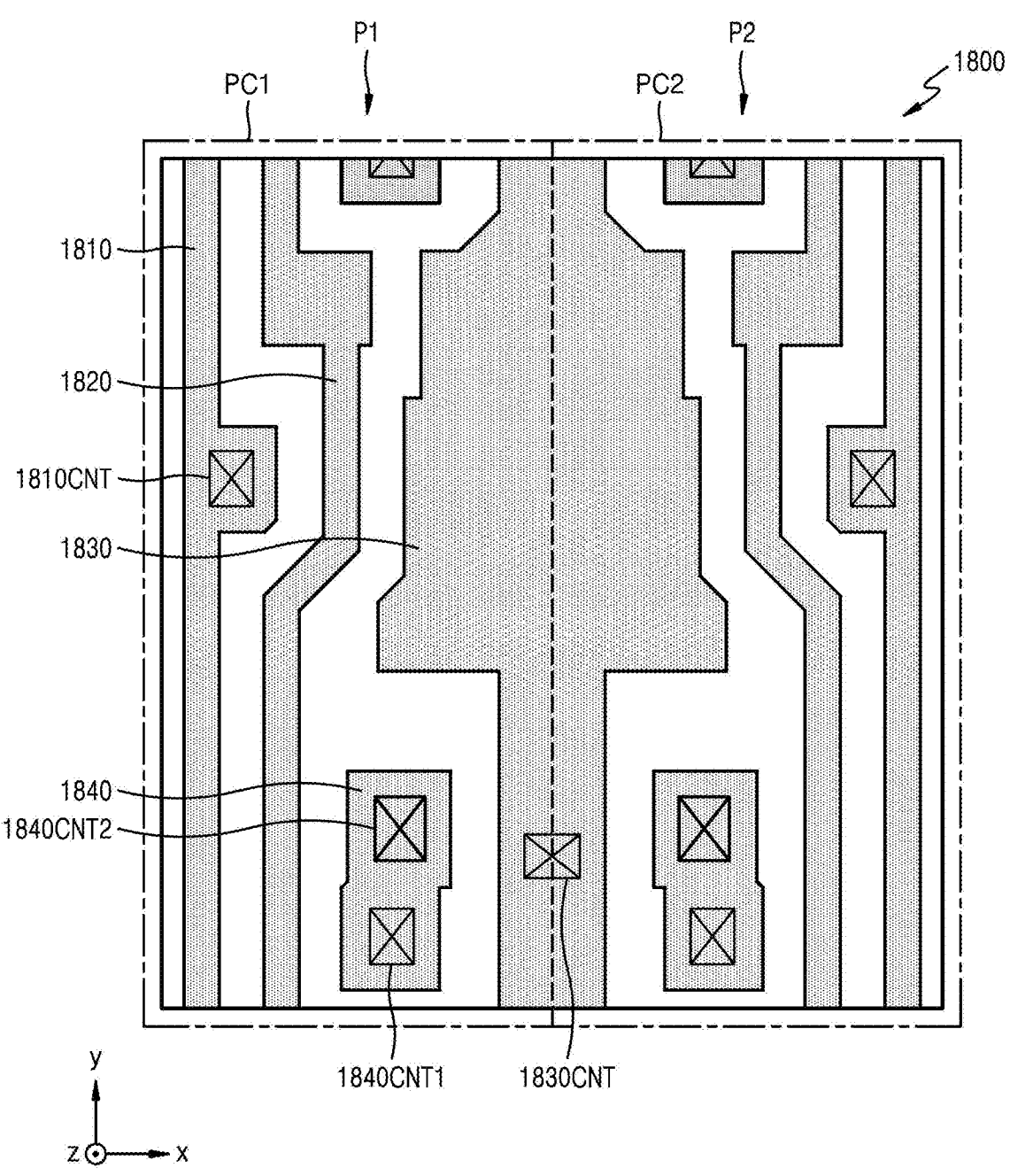
Figure 14:
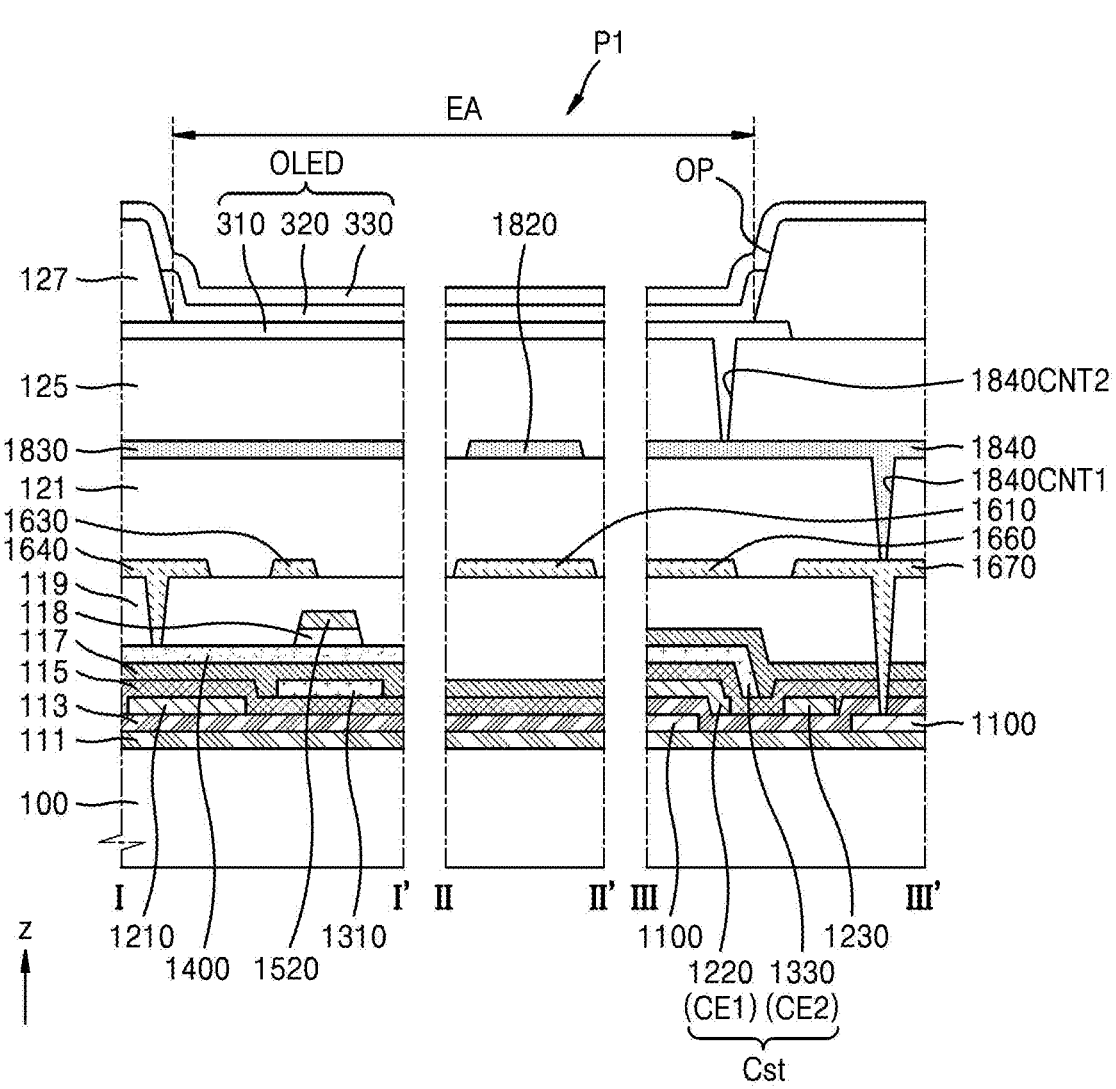
FIG. 14 is a schematic cross-sectional view of the display panel shown in FIG. 6, taken along lines I-I, II-II', and III-III'.

FIG. 6 is a schematic plan view showing positions of transistors, capacitors, and the like in pixels PX included in a display apparatus of FIG. 1, FIGS. 7 to 13 are schematic plan views showing, for each layer, elements such as transistors, capacitors, and the like of the display apparatus shown in FIG. 6, and FIG. 14 is a schematic cross-sectional view of the display apparatus shown in FIG. 6, taken along lines I-I', II-II', and III-III'.

As shown in the drawings, the display apparatus may include a first pixel P1 and a second pixel P2 adjacent to each other. As shown in FIG. 6, the first pixel P1 may be symmetrical to the second pixel P2 with respect to a virtual line. In another embodiment, the first pixel P1 and the second pixel P2 may have an unsymmetrical same structure. The first pixel P1 may include a first pixel circuit PC1, and the second pixel P2 may include a second pixel circuit PC2. Hereinafter, for convenience of description, conductive patterns will be described based on the first pixel circuit PC1, and the conductive patterns may be symmetrically arranged in the second pixel circuit PC2. The first pixel circuit PC1 or the second pixel circuit PC2 means the pixel circuit denoted by a reference numeral PC in FIG. 5. An organic light-emitting element OLED may be electrically connected to each of the first pixel circuit PC1 and the second pixel circuit PC2. The organic light-emitting element OLED may be a display element denoted by a reference numeral OLED in FIG. 5.

A buffer layer 111 may be disposed on the substrate 100 (see FIG. 14). The buffer layer 111 may include silicon oxide, silicon nitride, or silicon oxynitride. The buffer layer 111 may prevent metal atoms or impurities from the substrate 100 from diffusing to a first semiconductor layer 1100 located thereon. The buffer layer 111 may allow the first semiconductor layer 1100 to be uniformly crystalized by adjusting a heat-providing speed during a crystallization process for forming the first semiconductor layer 1100.

Figure 7:
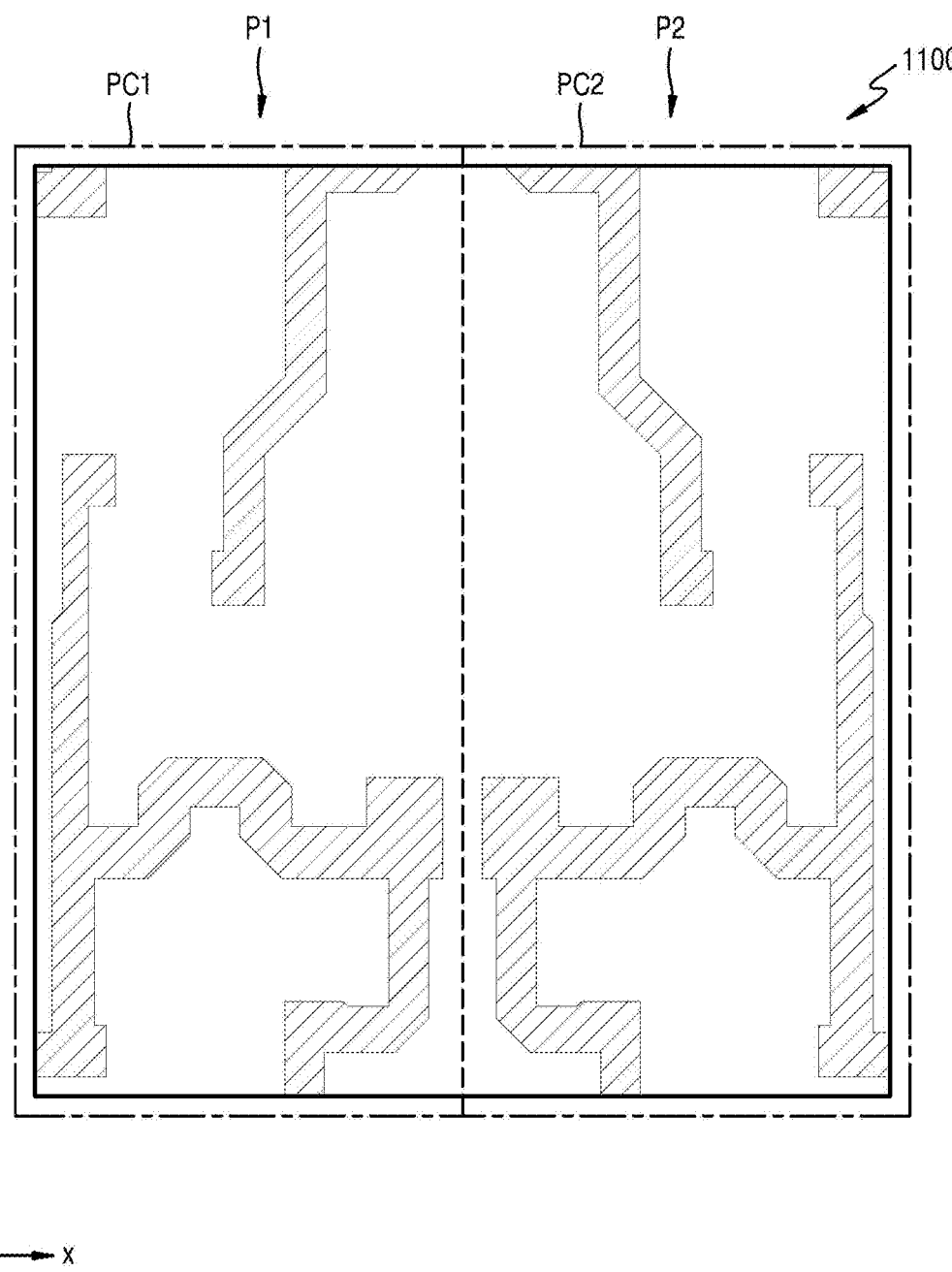
FIGS. 7 to 13 are schematic plan views showing, for each layer, elements such as transistors, capacitors, and the like of the display panel shown in FIG. 6.

The first semiconductor layer 1100 shown in FIG. 7 may be disposed on the buffer layer 111. The first semiconductor layer 1100 may include a silicon semiconductor. For example, the first semiconductor layer 1100 may include an amorphous silicon or a polycrystalline silicon. For example, the first semiconductor layer 1100 may include a polycrystalline silicon crystallized at low temperature. Ions may be implanted in at least a portion of the first semiconductor layer 1100.

The driving transistor T1, the switching transistor T2, the operation control transistor T5, the emission control transistor T6, and the second initialization transistor T7 may be PMOS as described above, and the thin-film transistors may be located along the first semiconductor layer 1100 shown in FIG. 7.

A first gate insulating layer 113 (see FIG. 14) may cover the first semiconductor layer 1100 and be disposed over the substrate 100. The first gate insulating layer 113 may include an insulating material. For example, the first gate insulating layer 113 may include silicon oxide, silicon nitride, silicon oxynitride, aluminum oxide, or the like.

Figure 8:
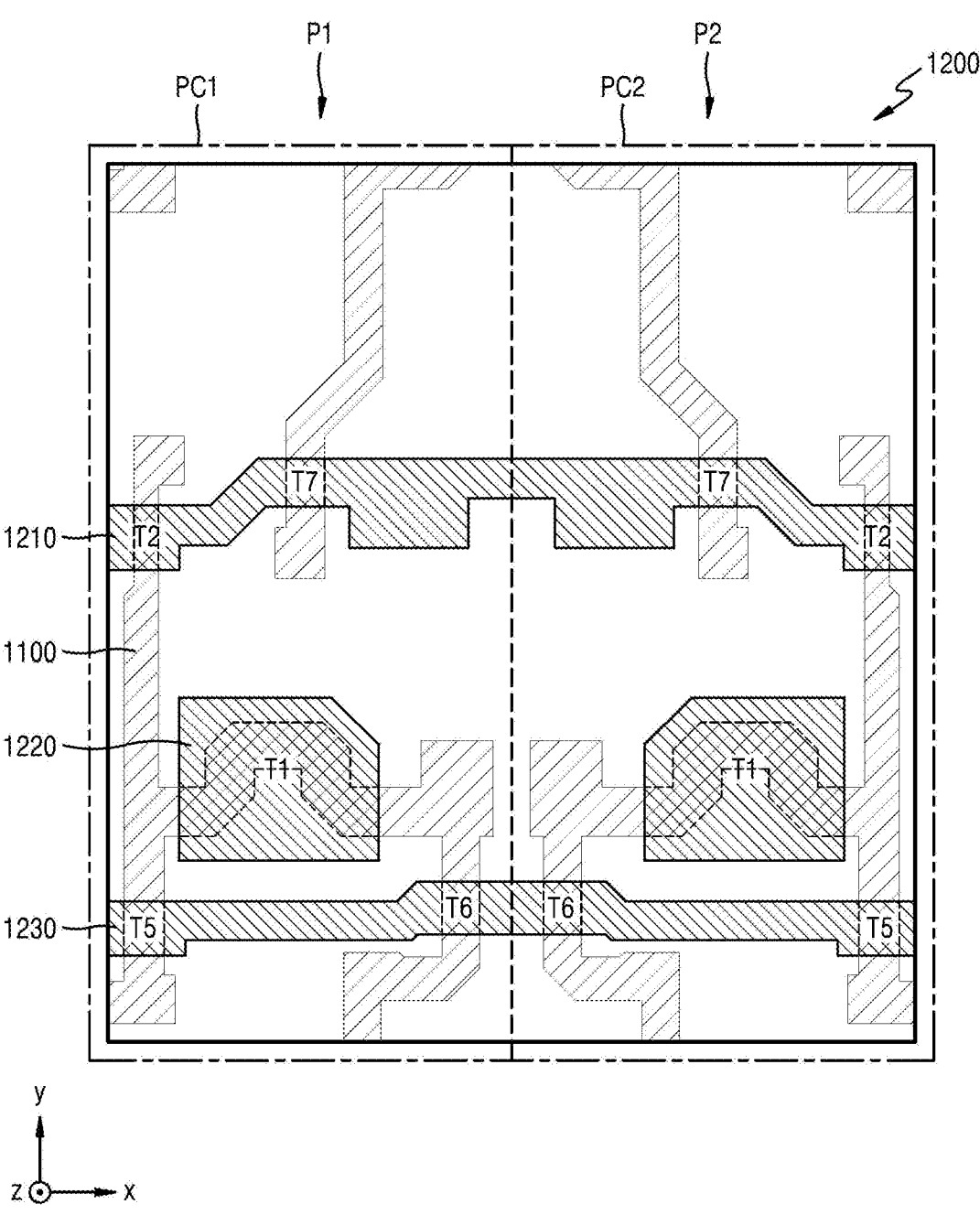

A first gate layer 1200 shown in FIG. 8 may be disposed on the first gate insulating layer 113. For convenience of description, FIG. 8 shows the first gate layer 1200 together with the first semiconductor layer 1100. The first gate layer 1200 may include a first gate line 1210, a first gate electrode 1220, and a second gate line 1230.

The first gate line 1210 may extend in the second direction (the x-axis direction). The first gate line 1210 may be the scan line SL of FIG. 1 and the first scan line SL1 or the next scan line SLn of FIG. 5. For example, with respect to the first pixel P1 shown in FIG. 8, the first gate line 1210 may correspond to the first scan line SL1 of FIG. 5, and with respect to a pixel adjacent (in the +y direction) to the first pixel P1, the first gate line 1210 may correspond to the next scan line SLn of FIG. 5. Accordingly, a first scan signal Sn and a next scan signal Sn+1 may be applied to the pixels through the first gate line 1210. Portions of the first gate line 1210 overlapping the first semiconductor layer 1100 may be a switching gate electrode of the switching transistor T2 and the second initialization gate electrode of the second initialization transistor T7.

The first gate electrode 1220 may have an isolated shape. The first gate electrode 1220 may be the driving gate electrode of the driving transistor T1. For example, a portion of the first semiconductor layer 1100 overlapping the first gate electrode 1220 and a near portion thereof may be a driving semiconductor layer.

The second gate line 1230 may extend in the second direction (the x-axis direction). The second gate line 1230 may correspond to an emission control line EL of FIG. 5. Portions of the second gate line 1230 overlapping the first semiconductor layer 1100 may be the operation control gate electrode of the operation control transistor T5 and the emission control gate electrode of the emission control transistor T6. An emission control signal En may be applied to the pixels through the second gate line 1230.

The first gate layer 1200 may include a metal, an alloy, a conductive metal oxide, a transparent conductive material, or the like. For example, the first gate layer 1200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The first gate layer 1200 may have a multi-layered structure and have, for example, a two-layered structure of Mo/Al or a three-layered structure of Mo/Al/Mo.

A second gate insulating layer 115 (see FIG. 14) may cover the first gate layer 1200 and be disposed on the first gate insulating layer 113. The second gate insulating layer 115 and the first gate insulating layer 113 may include a same or similar material (e.g., an insulating material).

Figure 9:
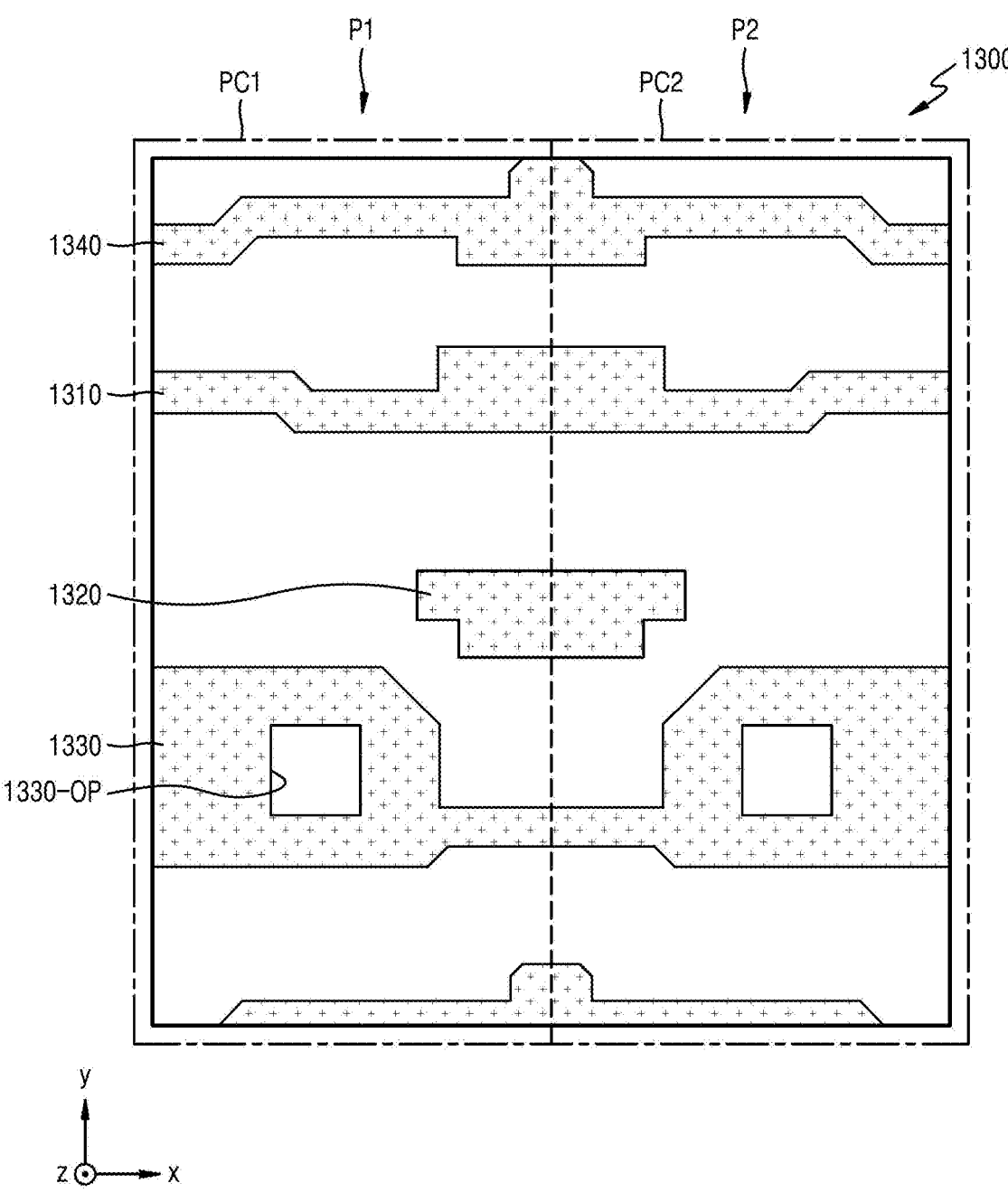

A second gate layer 1300 shown in FIG. 9 may be disposed on the second gate insulating layer 115. The second gate layer 1300 may include a third gate line 1310, a fourth gate line 1320, a capacitor upper electrode 1330, and a first initialization voltage line 1340 (for example, the first initialization voltage line VL1 of FIG. 5).

The third gate line 1310 may extend in the second direction (the x-axis direction). The third gate line 1310 may correspond to the previous scan line SLp of FIG. 5. The third gate line 1310 may be spaced apart from the first gate line 1210 in a plan view. A previous scan signal Sn−1 may be applied to the pixels through the third gate line 1310. A portion of the third gate line 1310 overlapping a second semiconductor layer 1400 described below may be a first initialization lower gate electrode of the first initialization transistor T4.

The fourth gate line 1320 may also extend in the second direction (e.g., the x-axis direction) and have an isolated shape. The fourth gate line 1320 may be electrically connected to a sixth gate line 1530 described below and may correspond to the second scan line SL2 of FIG. 5. The fourth gate line 1320 may be spaced apart from the first gate line 1210 and the third gate line 1310 in a plan view. A second scan signal Sn' may be applied to the pixels through the fourth gate line 1320. A portion of the fourth gate line 1320 overlapping the second semiconductor layer 1400 described below may be a compensation lower gate electrode of the compensation transistor T3.

The third gate line 1310 and the fourth gate line 1320 may be located below the second semiconductor layer 1400 described below with reference to FIG. 10 to serve as not only gate electrodes but also a lower protective metal protecting portions overlapping the third gate line 1310 and the fourth gate line 1320 of the second semiconductor layer 1400.

The capacitor upper electrode 1330 may overlap the first gate electrode 1220 and extend in the second direction (e.g., the x-axis direction). The capacitor upper electrode 1330 may correspond to the second capacitor electrode CE2 of FIG. 5 and constitute the storage capacitor Cst with the first gate electrode 1220. The driving voltage ELVDD may be applied to the capacitor upper electrode 1330. A hole passing through the capacitor upper electrode 1330 may be formed in the capacitor upper electrode 1330, and at least a portion of the first gate electrode 1220 may overlap the hole.

The first initialization voltage line 1340 corresponding to the first initialization voltage line VL1 of FIG. 5 may extend in the second direction (e.g., the x-axis direction). The first initialization voltage line 1340 may be spaced apart from the third gate line 1310 in a plan view. The first initialization voltage Vint1 may be applied to the pixels through the first initialization voltage line 1340. The first initialization voltage line 1340 may at least partially overlap the second semiconductor layer 1400 described below and may transfer the first initialization voltage Vint1 to the second semiconductor layer 1400. The first initialization voltage line 1340 may be electrically connected to the second semiconductor layer 1400 through contact holes 1680CNT1, 1680CNT2, and 1680CNT3 described with reference to FIG. 12.

The second gate layer 1300 may include a metal, an alloy, a conductive metal oxide, a transparent conductive material, or the like. For example, the second gate layer 1300 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The second gate layer 1300 may have a multi-layered structure and have, for example, a two-layered structure of Mo/Al or a three-layered structure of Mo/Al/Mo.

A first interlayer insulating layer 117 (see FIG. 14) may cover the second gate layer 1300 and be disposed on the second gate insulating layer 115. The first interlayer insulating layer 117 may include an insulating material. For example, the first interlayer insulating layer 117 may include silicon oxide, silicon nitride, silicon oxynitride, aluminum oxide, or the like.

Figure 10:
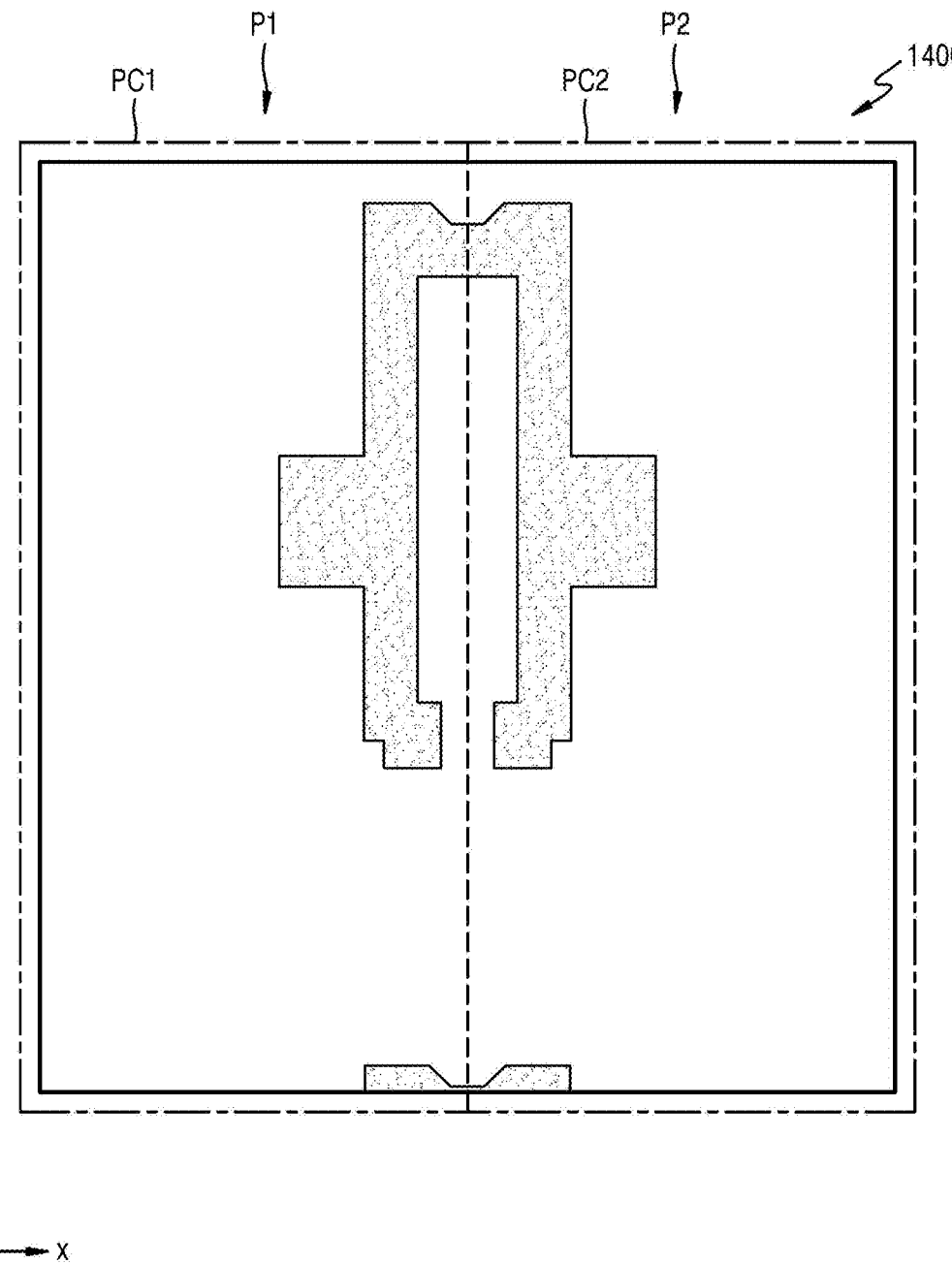

A second semiconductor layer 1400 shown in FIG. 10 may be disposed on the first interlayer insulating layer 117. As described above, the second semiconductor layer 1400 may include an oxide semiconductor. The second semiconductor layer 1400 and the first semiconductor layer 1100 may be disposed on different layers, and the second semiconductor layer 1400 may not overlap the first semiconductor layer 1100 in a plan view.

A third gate insulating layer 118 (see FIG. 14) may cover the second semiconductor layer 1400 and be disposed on the first interlayer insulating layer 117. The third gate insulating layer 118 may include an insulating material. In another embodiment, as shown in FIG. 14, the third gate insulating layer 118 may be disposed on only a portion of the second semiconductor layer 1400 and may not be disposed on the first interlayer insulating layer 117, and the third gate insulating layer 118 and a third gate layer 1500 described below with reference to FIG. 11 may have a same pattern. For example, the third gate insulating layer 118 may completely or almost completely overlap the third gate layer 1500 in a plan view. This is because the third gate insulating layer 118 and the third gate layer 1500 are simultaneously patterned. Accordingly, except for channel regions overlapping the third gate layer 1500, source regions and drain regions of the second semiconductor layer 1400 may not be covered by the third gate insulating layer 118. The source regions and the drain regions may directly contact the second interlayer insulating layer 119 as shown in FIG. 14. The third gate insulating layer 118 may include silicon oxide, silicon nitride, silicon oxynitride, aluminum oxide, or the like.

Figure 11:
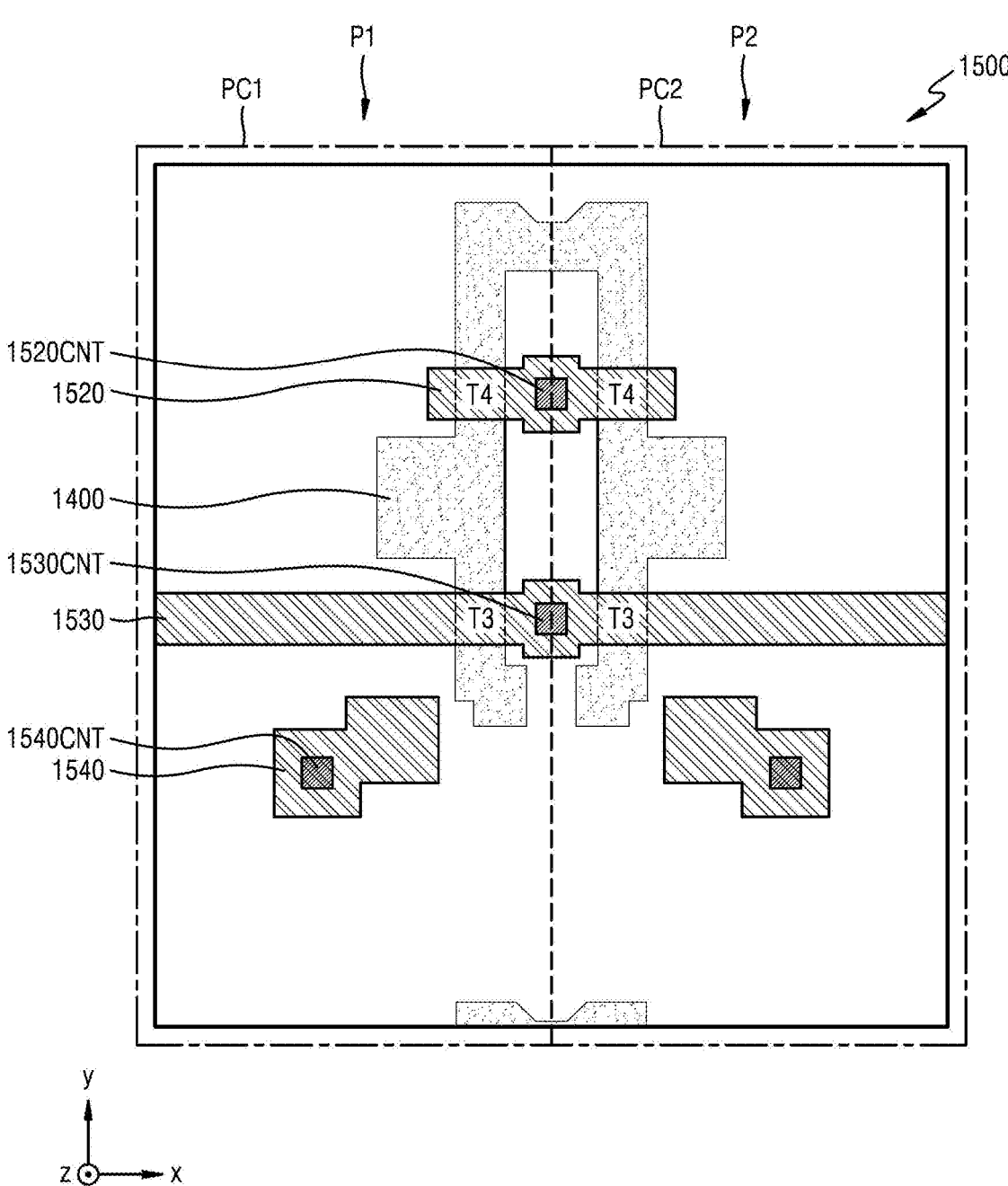

The third gate layer 1500 shown in FIG. 11 may be disposed on the third gate insulating layer 118. The third gate layer 1500 may include a fifth gate line 1520, a sixth gate line 1530, and a first transfer line 1540.

The fifth gate line 1520 may extend in the second direction (e.g., the x-axis direction) and have an isolated shape. The fifth gate line 1520 may overlap the third gate line 1310 in a plan view. A portion of the fifth gate line 1520 overlapping the second semiconductor layer 1400 may be a first initialization upper gate electrode of the first initialization transistor T4. A portion of the second semiconductor layer 1400 overlapping the fifth gate line 1520 and a near portion thereof may be a first initialization semiconductor layer. The fifth gate line 1520 may be electrically connected to the third gate line 1310. For example, the fifth gate line 1520 may be electrically connected to the third gate line 1310 through a contact hole 1520CNT formed in an insulating layer between the fifth gate line 1520 and the third gate line 1310. Accordingly, the fifth gate line 1520 together with the third gate line 1310 may correspond to the previous scan line SLp of FIG. 5. Accordingly, a previous scan signal Sn−1 may be applied to the pixels through the fifth gate line 1520 and/or the third gate line 1310.

The sixth gate line 1530 may extend in the second direction (the x-axis direction). The sixth gate line 1530 may overlap the fourth gate line 1320 in a plan view. A portion of the sixth gate line 1530 overlapping the second semiconductor layer 1400 may be a compensation upper gate electrode of the compensation transistor T3. The sixth gate line 1530 may be electrically connected to the fourth gate line 1320. For example, the sixth gate line 1530 may be electrically connected to the fourth gate line 1320 through a contact hole 1530CNT formed in an insulating layer between the sixth gate line 1530 and the fourth gate line 1320. Accordingly, the sixth gate line 1530 together with the fourth gate line 1320 may correspond to the second scan line SL2 of FIG. 5. Accordingly, a second scan signal Sn' may be applied to the pixels through the sixth gate line 1530 and/or the fourth gate line 1320.

The first transfer line 1540 may be electrically connected to the first gate electrode 1220, which is the driving gate electrode, through a contact hole 1540CNT passing through an opening 1330-OP (see FIG. 9) of the capacitor upper electrode 1330. The first transfer line 1540 may transfer the first initialization voltage Vint1 to the first gate electrode 1220, the first initialization voltage Vint1 being transferred through the first initialization transistor T4.

The third gate layer 1500 may include a metal, an alloy, a conductive metal oxide, a transparent conductive material, or the like. For example, the third gate layer 1500 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The third gate layer 1500 may have a multi-layered structure and have, for example, a two-layered structure of Mo/Al or a three-layered structure of Mo/Al/Mo.

The second interlayer insulating layer 119 (see FIG. 14) may cover at least a portion of the third gate layer 1500 of FIG. 11. The second interlayer insulating layer 119 may include an insulating material. For example, the second interlayer insulating layer 119 may include silicon oxide, silicon nitride, silicon oxynitride, aluminum oxide, or the like.

A first connection electrode layer 1600 shown in FIG. 12 may be disposed on the second interlayer insulating layer 119. The first connection electrode layer 1600 may include a horizontal connection line 1610, a second transfer line 1620, a second initialization voltage line 1630, a third transfer line 1640, a fourth transfer line 1650, a fifth transfer line 1660, a sixth transfer line 1670, and a seventh transfer line 1680.

The horizontal connection line 1610 may extend in the second direction (the x-axis direction). The first horizontal connection line 201a and the second horizontal connection line 201b described above with reference to FIG. 1 may be implemented by the horizontal connection line 1610 of FIG. 12.

The second transfer line 1620 may be electrically connected to the first semiconductor layer 1100 through a contact hole 1620CNT. A data signal Dm from a data line 1810 described below with reference to FIG. 13 may be transferred to the first semiconductor layer 1100 through the second transfer line 1620 and transferred to the switching transistor T2.

The second initialization voltage line 1630 may extend in the second direction (the x-axis direction). The second initialization voltage line 1630 corresponding to the second initialization voltage line VL2 of FIG. 5 may apply the second initialization voltage Vint2 to the pixels. The second initialization voltage line 1630 may be electrically connected to the first semiconductor layer 1100 through the contact hole 1630CNT, the second initialization voltage Vint2 may be transferred to the first semiconductor layer 1100 and applied to the second initialization transistor T7.

The third transfer line 1640 may electrically connect the second semiconductor layer 1400 to the first transfer line 1540 through contact holes 1640CNT1 and 1640CNT2 formed in a side and another side thereof. Because the first transfer line 1540 is electrically connected to the first gate electrode 1220, which is the driving gate electrode, the third transfer line 1640 may, consequently, electrically connect the first initialization semiconductor layer, which is a portion of the second semiconductor layer 1400, to the driving gate electrode. The first initialization voltage Vint1 may be transferred to the first gate electrode 1220, which is the driving gate electrode, through the second semiconductor layer 1400, the third transfer line 1640, and the first transfer line 1540.

The fourth transfer line 1650 may electrically connect the second semiconductor layer 1400 to the first semiconductor layer 1100 through contact holes 1650CNT1 and 1650CNT2 formed in a side and another side thereof. For example, the fourth transfer line 1650 may electrically connect the compensation transistor T3 to the driving transistor T1.

The fifth transfer line 1660 may extend in the second direction (the x-axis direction). The driving voltage ELVDD, which is a constant voltage from a driving voltage line 1830 described below with reference to FIG. 13, may be transferred to the fifth transfer line 1660, and the fifth transfer line 1660 may be electrically connected to the first semiconductor layer 1100 through a contact hole 1660CNT1 to transfer the driving voltage ELVDD to the first semiconductor layer 1100, for example, the operation control transistor T5. The fifth transfer line 1660 electrically connected to the capacitor upper electrode 1330 (for example, the second capacitor electrode CE2 of FIG. 5) through a contact hole 1660CNT2 may transfer the driving voltage ELVDD to the capacitor upper electrode 1330.

The sixth transfer line 1670 may be electrically connected to the first semiconductor layer 1100 through a contact hole 1670CNT. The sixth transfer line 1670 may transfer a driving current or the second initialization voltage Vint2 from the first semiconductor layer 1100 to the organic light-emitting diode OLED.

The seventh transfer line 1680 may be electrically connected to the second semiconductor layer 1400 through the contact holes 1680CNT2 and 1680CNT3. The seventh transfer line 1680 may be electrically connected to the first initialization voltage line 1340 of FIG. 9 through the contact hole 1680CNT1. Through this, the seventh transfer line 1680 may transfer the first initialization voltage Vint1 from the first initialization voltage line 1340 to the first initialization transistor T4.

The first connection electrode layer 1600 may include a metal, an alloy, a conductive metal oxide, a transparent conductive material, or the like. For example, the first connection electrode layer 1600 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The first connection electrode layer 1600 may have a multi-layered structure and have, for example, a two-layered structure of Ti/Al or a three-layered structure of Ti/Al/Ti.

The third interlayer insulating layer 121 (see FIG. 14) may cover the first connection electrode layer 1600 and be disposed on the second interlayer insulating layer 119. The third interlayer insulating layer 121 may include an insulating material. For example, the third interlayer insulating layer 121 may include silicon oxide, silicon nitride, silicon oxynitride, aluminum oxide, or the like. In another embodiment, the third interlayer insulating layer 121 may include an organic insulating material. For example, the third interlayer insulating layer 121 may include a photoresist, benzocyclobutene (BCB), polyimide, hexamethyldisiloxane (HMDSO), polymethylmethacrylate (PMMA) or polystyrene, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a mixture thereof.

As shown in FIG. 14, a second connection electrode layer 1800 shown in FIG. 13 may be disposed on the third interlayer insulating layer 121. The second connection electrode layer 1800 may include a data line 1810, a vertical connection line 1820, a driving voltage line 1830, and a tenth transfer line 1840.

The data line 1810 may extend in the first direction (the y-axis direction). The data line 1810 may correspond to the data line DL of FIG. 5. The data line 1810 may be the first data line DL1 or the second data line DL2 shown in FIG. 1 depending on the location of the pixel. The data line 1810 may be electrically connected to the second transfer line 1620 through a contact hole 1810CNT, and a data signal Dm from the data line 1810 may be transferred to the first semiconductor layer 1100 through the second transfer line 1620 and be applied to the switching transistor T2.

The vertical connection line 1820 may generally extend in the first direction (the y-axis direction). The first vertical connection line 202a and the second vertical connection line 202b described above with reference to FIG. 1 may be implemented by the vertical connection line 1820 of FIG. 13.

The driving voltage line 1830 may generally extend in the first direction (the y-axis direction). The driving voltage line 1830 may correspond to the driving voltage line PL of FIG. 5. The driving voltage line 1830 may apply the driving voltage ELVDD to the pixels. The driving voltage line 1830 may be electrically connected to the fifth transfer line 1660 through a contact hole 1830CNT to transfer the driving voltage ELVDD to the operation control transistor T5 and the capacitor upper electrode 1330 as described above. The driving voltage line 1830 of the first pixel circuit PC1 and the driving voltage line 1830 of the second pixel circuit PC2 may be integral with each other.

The tenth transfer line 1840 may be electrically connected to the sixth transfer line 1670 through a contact hole 1840CNT1 to receive the driving current or the second initialization voltage Vint2 from the sixth transfer line 1670, the driving current or the second initialization voltage Vint2 coming from the first semiconductor layer 1100. The tenth transfer line 1840 may transfer the driving current or the second initialization voltage Vint2 to a first electrode (a pixel electrode) of the organic light-emitting diode OLED through a contact hole 1840CNT2 formed in an insulating layer located thereon, the driving current or the second initialization voltage Vint2 being from the first semiconductor layer 1100.

The second connection electrode layer 1800 may include a metal, an alloy, a conductive metal oxide, a transparent conductive material, or the like. For example, the second connection electrode layer 1800 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The second connection electrode layer 1800 may have a multi-layered structure and have, for example, a two-layered structure of Ti/Al or a three-layered structure of Ti/Al/Ti.

A planarization insulating layer 125 shown in FIG. 14 may cover the second connection electrode layer 1800 and be disposed on the third interlayer insulating layer 121. The planarization insulating layer 125 may include an organic insulating material. For example, the planarization insulating layer 125 may include benzocyclobutene (BCB), polyimide, hexamethyldisiloxane (HMDSO), polymethylmethacrylate (PMMA) or polystyrene, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a mixture thereof.

The organic light-emitting diode OLED may be disposed on the planarization insulating layer 125 shown in FIG. 14. The organic light-emitting diode OLED may include a pixel electrode 310, an intermediate layer 320, and an opposite electrode 330. The intermediate layer 320 may include an emission layer.

The pixel electrode 310 may be a (semi) light-transmissive electrode or a reflective electrode. For example, the pixel electrode 310 may include a reflective layer and a transparent or semi-transparent electrode layer on the reflective layer. The reflective layer may include at least one of Ag, Mg, Al, Pt, Pd, Au, Ni, Nd, Ir, Cr, and compound thereof. The transparent or semi-transparent electrode layer may include at least one of indium tin oxide (ITO), indium zinc oxide (IZO), zinc oxide (ZnO or ZnO$_2$), indium oxide (In$_2$O$_3$), indium gallium oxide (IGO), and aluminum zinc oxide (AZO). For example, the pixel electrode 310 may have a three-layered structure of ITO/Ag/ITO.

A pixel-defining layer 127 may be disposed on the planarization insulating layer 125. The pixel-defining layer 127 may prevent arcs and the like from occurring at the edges of each pixel electrode 310 by increasing a distance between the edges of each pixel electrode 310 and the opposite electrode 330.

The pixel-defining layer 127 may include an organic insulating material such as polyimide, an acrylic resin, benzocyclobutene, a phenolic resin, and the like and be formed by spin coating and the like.

At least a portion of the intermediate layer 320 of the organic light-emitting diode OLED may be located in an opening OP formed by the pixel-defining layer 127. An emission area EA of the organic light-emitting diode OLED may be defined by the opening OP.

The intermediate layer 320 may include an emission layer. The emission layer may include an organic material including a fluorescent or phosphorous material emitting red, green, blue, or white light. The emission layer may include a high molecular organic material or a low molecular organic material. Functional layers such as a hole transport layer (HTL), a hole injection layer (HIL), an electron transport layer (ETL), and an electron injection layer (EIL) may be selectively arranged under and on the emission layer.

The emission layer may have a patterned shape corresponding to each of the pixel electrodes 310. A layer included in the intermediate layer 320 except for the emission layer may be one body over the pixel electrodes 310. However, the disclosure is not limited thereto.

The opposite electrode 330 may be a light-transmissive electrode or a reflective electrode. For example, the opposite electrode 330 may be a transparent or semi-transparent electrode and may include a metal thin film including Li, Ca, Al, Ag, Mg, or compound thereof (e.g., LiF). The opposite electrode 330 may further include a transparent conductive oxide (TCO) layer such as a layer including ITO, indium zinc oxide (IZO), ZnO, or $In_2O_3$, disposed on the metal thin film. The opposite electrode 330 may be integrally formed over the entire surface of the display area DA and disposed on the intermediate layer 320 and the pixel-defining layer 127.

The organic light-emitting diode OLED may be covered by a thin-film encapsulation layer (not shown) or an encapsulation substrate. In an embodiment, the thin-film encapsulation layer may include at least one inorganic encapsulation layer and at least one organic encapsulation layer. For example, the thin-film encapsulation layer may include a first inorganic encapsulation layer and a second inorganic encapsulation layer, and an organic encapsulation layer therebetween.

The first inorganic encapsulation layer and the second inorganic encapsulation layer may each include at least one inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and be formed by chemical vapor deposition (CVD). The organic encapsulation layer may include a polymer-based material. The polymer-based material may include a silicon-based resin, an acryl-based resin (e.g., polymethyl methacrylate, polyacrylic acid, and the like), an epoxy-based resin, polyimide, and polyethylene.

The first inorganic encapsulation layer, the organic encapsulation layer, and the second inorganic encapsulation layer may each be integrally formed to cover the display area DA.

A bottom metal layer (not illustrated) may be disposed below the first pixel circuit PC1 and the second pixel circuit PC2. To protect the first pixel circuit PC1 and the second pixel circuit PC2, the bottom metal layer may be disposed between the first pixel circuit PC1 and the second pixel circuit PC2 and the substrate 100 to overlap the first pixel circuit PC1 and the second pixel circuit PC2. The bottom metal layer may prevent or reduce external light or an electric field formed on the substrate 100 from reaching the first pixel circuit PC1 and the second pixel circuit PC2 and influencing first pixel circuit PC1 and the second pixel circuit PC2.

Figure 15:
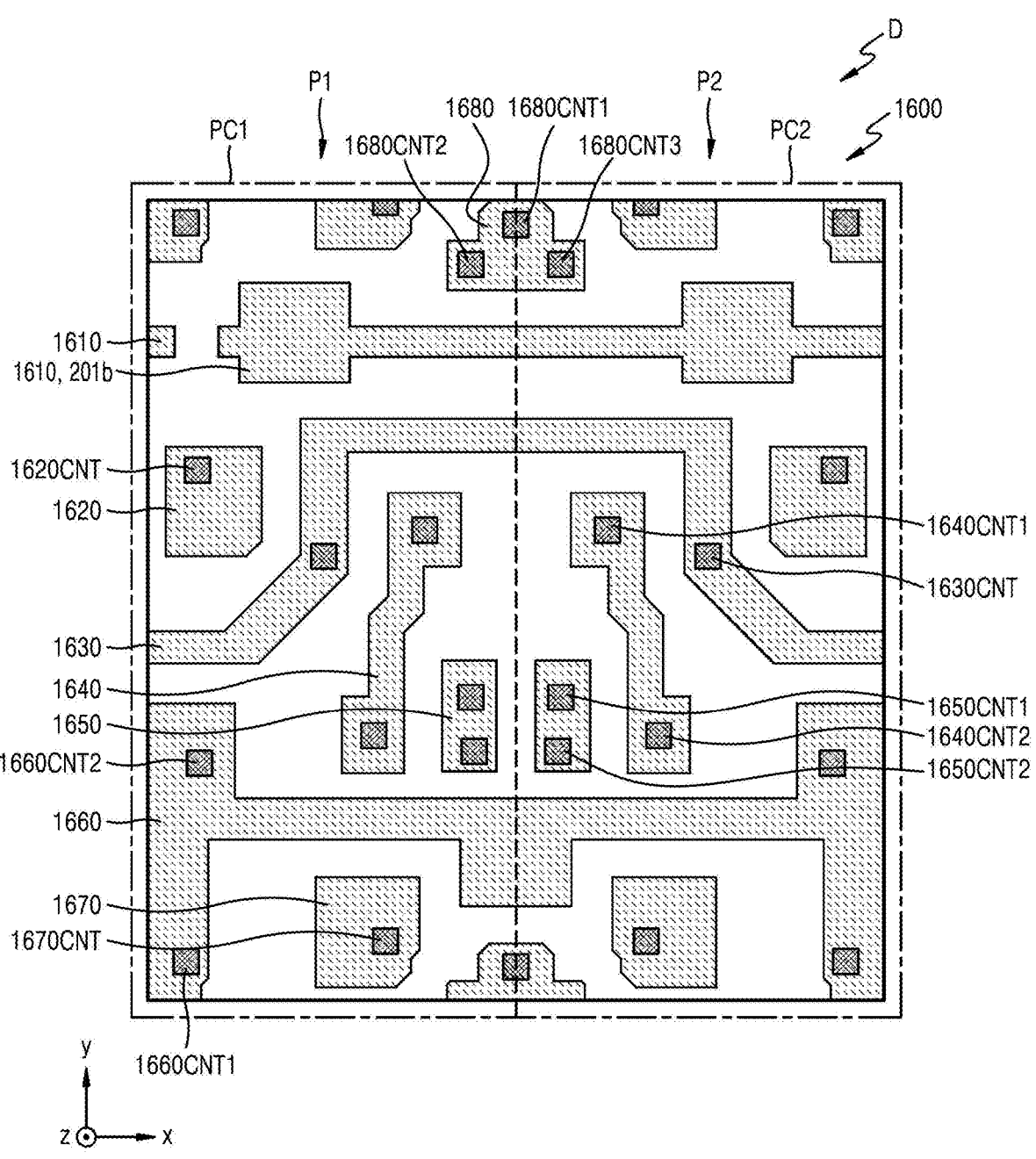
FIGS. 15 and 16 are schematic plan views of some layers in region D of FIG. 4.
Figure 16:
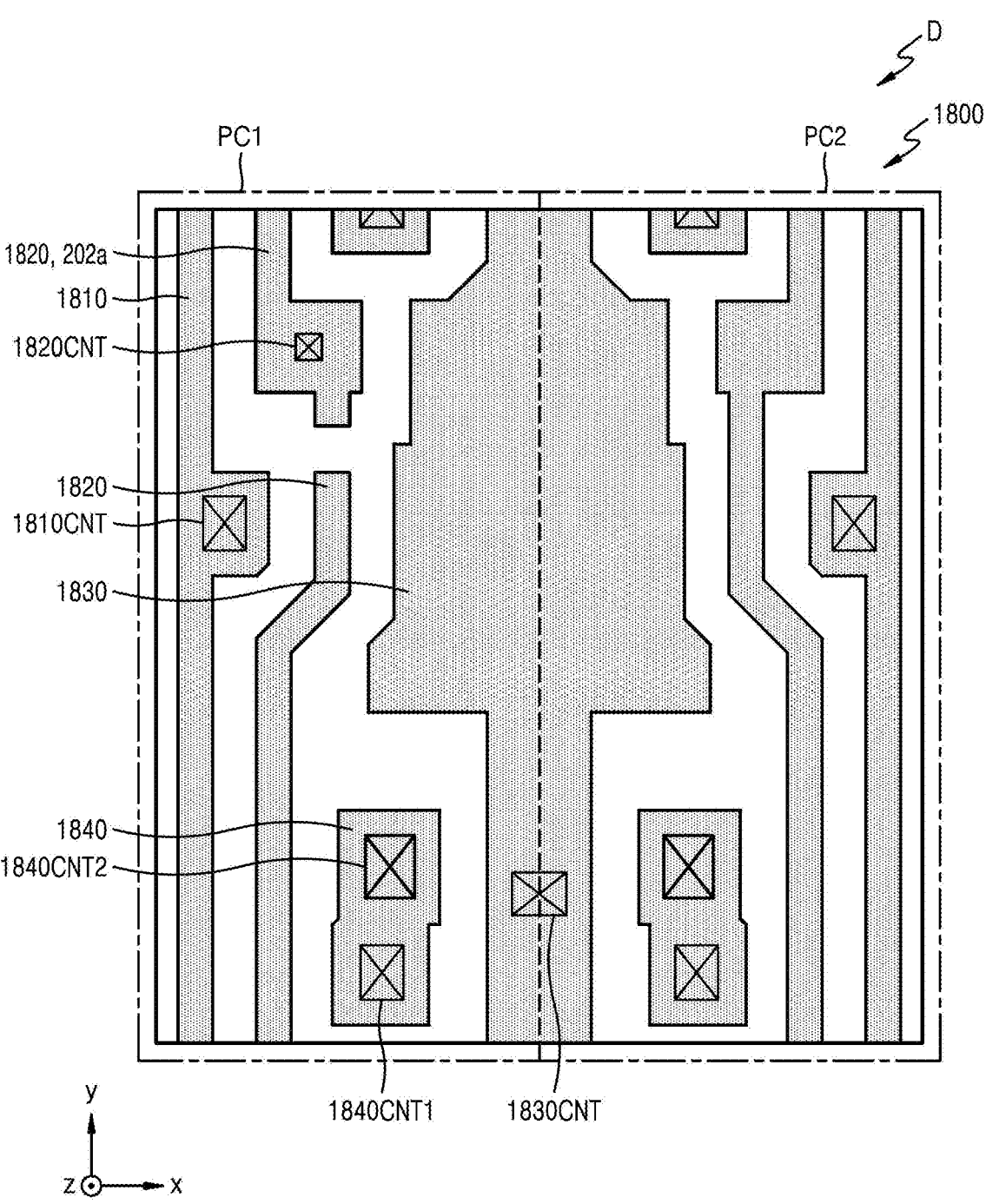

FIGS. 15 and 16 are schematic plan views of some layers in region D of FIG. 4, for example, the first connection electrode layer 1600 and the second connection electrode layer 1800. The first vertical connection line 202a may be electrically connected to the second horizontal connection line 201b in the region D of FIG. 4. The first vertical connection line 202a in the region D of FIG. 4 may be implemented by the vertical connection line 1820 shown in FIG. 16, and the second horizontal connection line 201b in the region D of FIG. 4 may be implemented by the horizontal connection line 1610 shown in FIG. 15.

As shown in FIG. 15, the horizontal connection line 1610 extending in the second direction (the x-axis direction) may be discontinuous. For example, the horizontal connection line 1610 may have a first discontinuous point, and a portion located on a side (in the +x direction) of the first discontinuous point may serve as the second horizontal connection line 201b. As shown in FIG. 16, the vertical connection line 1820 extending in the first direction (the y-axis direction) may be also discontinuous. For example, the vertical connection line 1820 may have a first discontinuous point, and a portion located on a side (in the +y direction) of the first discontinuous point may serve as the first vertical connection line 202a. For example, an electrical signal may not be applied or a constant voltage such as the second power voltage ELVSS may be applied to a portion located on another side (in the −x direction) of the first discontinuous point of the horizontal connection line 1610. Likewise, an electrical signal may not be applied or a constant voltage such as the second power voltage ELVSS may be applied to a portion located on another side (in the −y direction) of the first discontinuous point of the vertical connection line 1820.

A contact hole 1820CNT shown in FIG. 16 may be the second contact hole CNT2 shown in FIG. 1 and may be formed in the third interlayer insulating layer 121 disposed between the vertical connection line 1820 and the horizontal connection line 1610. The first vertical connection line 202a may be electrically connected to the second horizontal connection line 201b through the contact hole 1820CNT.

Figure 17:
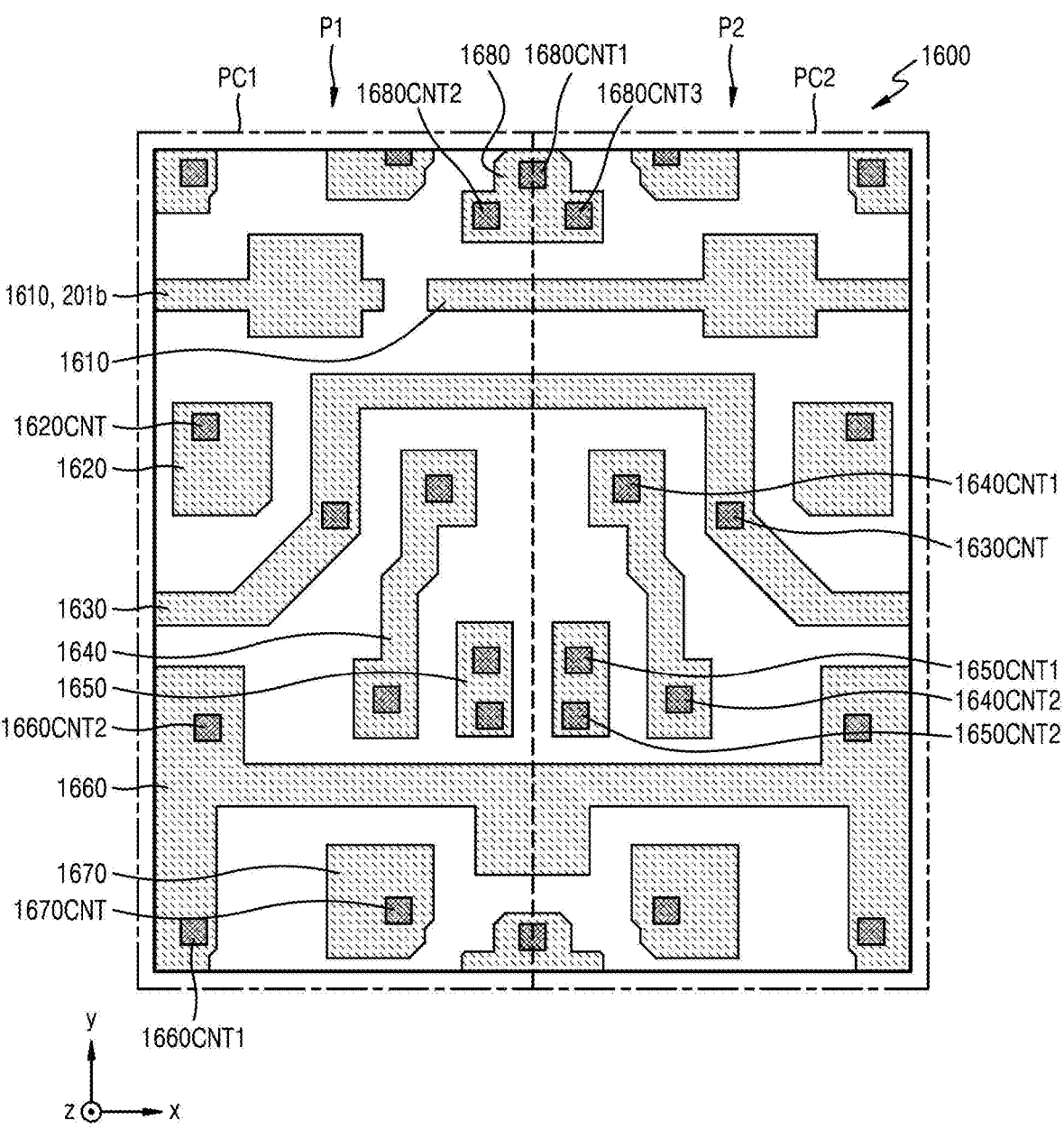
FIGS. 17 and 18 are schematic plan views of some layers in region E of FIG. 4.
Figure 18:
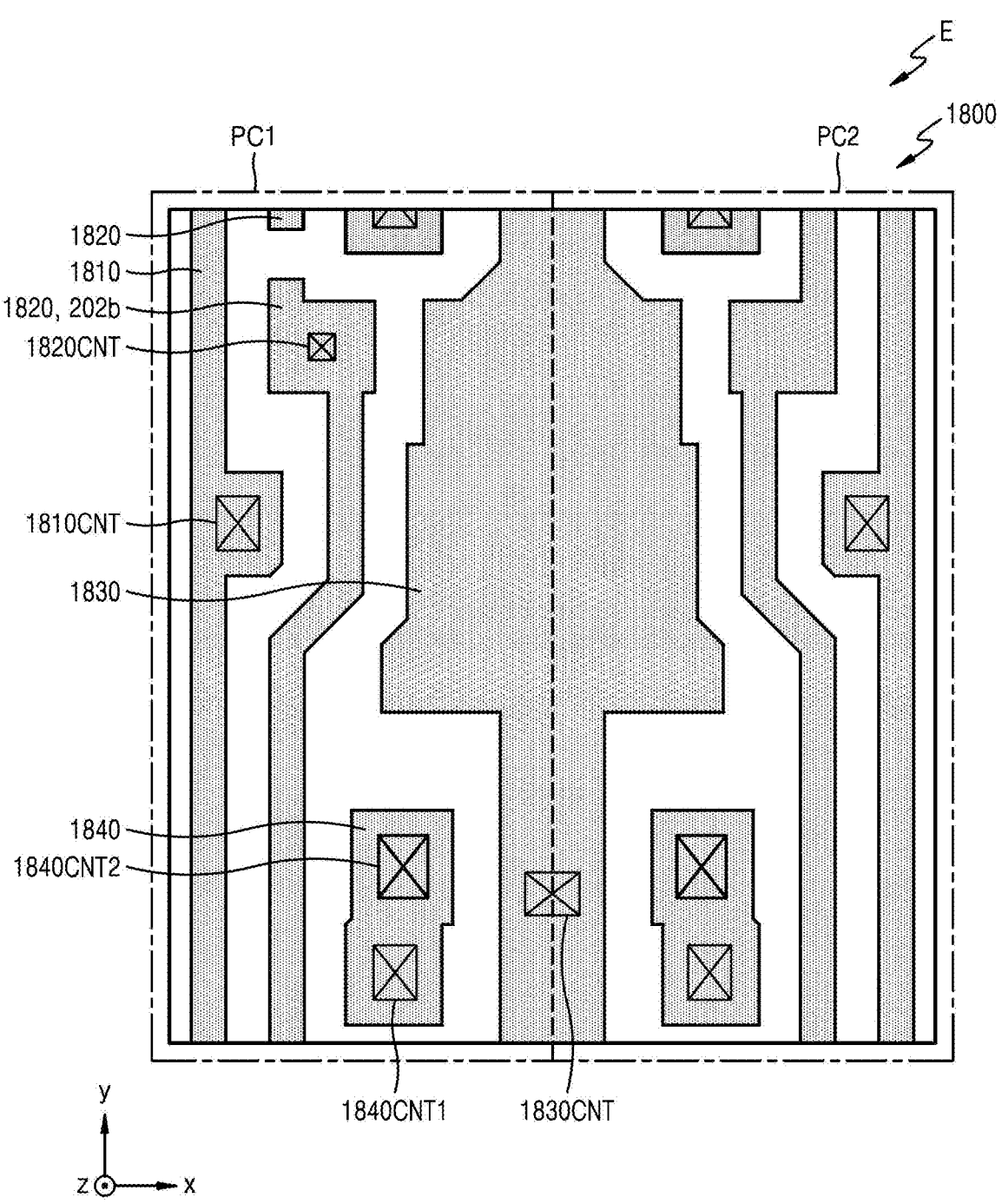

FIGS. 17 and 18 are schematic plan views of some layers in region E of FIG. 4, for example, the first connection electrode layer 1600 and the second connection electrode layer 1800. The second horizontal connection line 201b may be electrically connected to the second vertical connection line 202b in the region E of FIG. 4. The second horizontal connection line 201b in the region E of FIG. 4 may be implemented by the horizontal connection line 1610 shown in FIG. 17, and the second vertical connection line 202b in the region E of FIG. 4 may be implemented by the vertical connection line 1820 shown in FIG. 18.

The horizontal connection line 1610 extending in the second direction (e.g., the x-axis direction) may have a second discontinuous point shown in FIG. 17 as well as the first discontinuous point shown in FIG. 15, and a portion located on a side (in the −x direction) of the second discontinuous point may serve as the second horizontal connection line 201b. As shown in FIG. 18, the vertical connection line 1820 extending in the first direction (the y-axis direction) may also have a second discontinuous point, and a portion located on a side (in the −y direction) of the second discontinuous point may serve as the second vertical connection line 202b. For example, an electrical signal may not be applied to a portion located on another side (in the +x direction) of the second discontinuous point of the horizontal connection line 1610. Likewise, an electrical signal may not be applied or a constant voltage such as the second power voltage ELVSS may be applied to a portion located on another side (in the +y direction) of the second discontinuous point of the vertical connection line 1820.

A contact hole 1820CNT shown in FIG. 18 may be the second contact hole CNT2 shown in FIG. 1 and may be formed in the third interlayer insulating layer 121 disposed between the vertical connection line 1820 and the horizontal connection line 1610. The second vertical connection line 202*b* may be electrically connected to the second horizontal connection line 201*b* through the contact hole 1820CNT.

As described above, the first data lines DL1 may be electrically connected to the second connection line 203 by the first connection line 201*a*, 201*b*, 202*a*, and 202*b*. For example, the another end (in the −y direction) of the second vertical connection line 202*b* may be located in the peripheral area PA as shown in FIGS. 1 and 4. Accordingly, as shown in FIG. 1, the first connection line 201*a*, 201*b*, 202*a*, and 202*b* may have a shape indented once in a plan view. The indented shape may be formed by the first vertical connection line 202*a* and the second horizontal connection line 201*b*.

In a comparative example, the first data line DL1 may be electrically connected to the second connection line 203 without the indented shape. For example, in the display apparatus according to the comparative example, only one long horizontal connection line connected to the first data line DL1 through the first contact hole CNT1, and one long vertical connection line connected to the horizontal connection line through the second contact hole CNT2 may be provided, and the one long vertical connection line may be connected to the second connection line 203. However, in the comparative example, electrical signal interferences may occur between the one horizontal connection line extending in the second direction (e.g., the x-axis direction) and an adjacent scan line SL extending in the second direction (e.g., the x-axis direction). Because the horizontal connection line transfers a data signal to be applied to the first data line DL1, in case that electrical signal interferences occur between the horizontal connection line and the scan line SL, an accurate data signal may not be transferred to the first data line DL1, and thus, high-quality images may not be displayed.

In the display apparatus according to an embodiment, the first connection line 201*a*, 201*b*, 202*a*, and 202*b* may have a shape indented once in a plan view. The indented shape may be formed by the first vertical connection line 202*a* and the second horizontal connection line 201*b*. Accordingly, a length in the second direction (e.g., the x-axis direction) of each of the first horizontal connection line 201*a* and the second horizontal connection line 201*b* may be less than a length of the horizontal connection line extending in the second direction (e.g., the x-axis direction) of a display apparatus according to the comparative example. Accordingly, electrical signal interferences between the first horizontal connection line 201*a* and the scan line SL adjacent thereto may be remarkably reduced, and likewise, electrical signal interferences between the second horizontal connection line 201*b* and the scan line SL adjacent thereto may be remarkably reduced. Through this, the display apparatus may display high-quality images.

In another comparative example, a greater number of horizontal connection lines instead of two horizontal connection lines such as the first horizontal connection line 201*a* and the second horizontal connection line 201*b* may be used between the first data line DL1 and the second connection line 203, and a greater number of vertical connection lines instead of two vertical connection lines may be connected to the horizontal connection lines through a large number of second contact holes CNT2 to reduce the length in the second direction (e.g., the x-axis direction) of each of the horizontal connection lines. However, as the number of second contact holes CNT2 between the first data line DL1 and the second connection line 203 increases, a contact resistance and the like may remarkably increase. Accordingly, in the display apparatus according to an embodiment, because the first connection line 201*a*, 201*b*, 202*a*, and 202*b* may have a shape indented once in a plan view, the display apparatus may have a reduced resistance and may display high-quality images.

Figure 19:
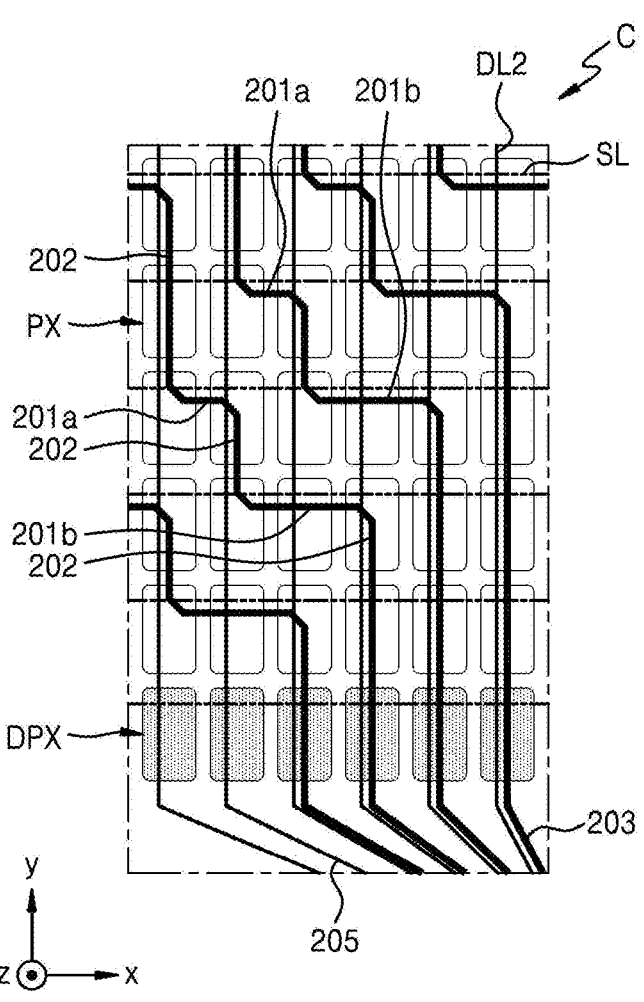
FIG. 19 is a schematic plan view of a portion of a display apparatus according to an embodiment.

FIG. 19 is a schematic plan view of a portion of a display apparatus according to an embodiment. The display apparatus according to an embodiment may include the first connection line 201*a*, 201*b*, and 202 connecting the first data line DL1 to the second connection line 203. For example, an end of the first connection line 201*a*, 201*b*, and 202 may be connected to the first data line DL1 in the display area DA, and another end may be located in the peripheral area PA and connected to the second connection line 203.

The first connection line 201*a*, 201*b*, and 202 may include multiple horizontal connection lines extending in the second direction (e.g., the x-axis direction) and multiple vertical connection lines 202 extending in the first direction (e.g., the y-axis direction). The vertical connection lines 202 may connect the horizontal connection lines. The horizontal connection lines may include the first horizontal connection line 201*a* and the second horizontal connection line 201*b*. A first length in the second direction (e.g., the x-axis direction) of the first horizontal connection line 201*a* may be different from a second length in the second direction (e.g., the x-axis direction) of the second horizontal connection line 201*b*. Because the first length of the first horizontal connection line 201*a* is different from the second length of the second horizontal connection line 201*b*, the degree of influences by the scan lines SL extending in the second direction (e.g., the x-axis direction) may be dispersed.

For example, in one scan line SL, a first horizontal connection line 201*a* having a first length of the first connection line 201*a*, 201*b*, and 202 electrically connected to a first data line DL1 may be disposed adjacent to the scan line SL, and a second horizontal connection line 201*b* having a second length of another first connection line 201*a*, 201*b*, and 202 electrically connected to another first data line DL1 may be disposed adjacent to the scan line SL. Accordingly, by differentiating the degrees of influences by the scan line SL on the first data lines DL1, high-quality images may be displayed as a whole.

In the horizontal connection lines included in the first connection line 201*a*, 201*b*, and 202, the horizontal connection line connected to the first data line DL1 may be farther away from the peripheral area PA that includes the pad area PADA than other horizontal connection lines. For example, in the horizontal connection lines included in the first connection line 201*a*, 201*b*, and 202, a distance from a portion of the peripheral area PA in which the another end of the first connection line 201*a*, 201*b*, and 202 is connected to the second connection line 203, to the horizontal connection line connected to the first data line DL1 may be greater than distances from the portion of the peripheral area PA to the rest of horizontal connection lines.

Furthermore, distances from the peripheral area PA to the horizontal connection lines may decrease toward the center of the display area DA from the first edge E1 of the display area DA. For example, in the horizontal connection lines included in the first connection line 201*a*, 201*b*, and 202, distances from a portion of the peripheral area PA in which the another end of the first connection line 201*a*, 201*b*, and 202 is connected to the second connection line 203, to the horizontal connection lines may decrease toward the center of the display area DA in the second direction (e.g., the x-axis direction). Through this, a voltage drop due to a resistance may be prevented by reducing a total length of the first connection line 201*a*, 201*b*, and 202.

A region in which each pixel PX is located may be defined as a pixel area. As shown in FIG. 19, the first length may correspond to the width in the second direction (e.g., the x-axis direction) of one pixel area among the pixel areas. Assuming n is a natural number greater than 1, the second length may be n times the first length. FIG. 19 shows the case where n is 2, and the second length is twice the first length. n may be 2 or more.

Figure 20:
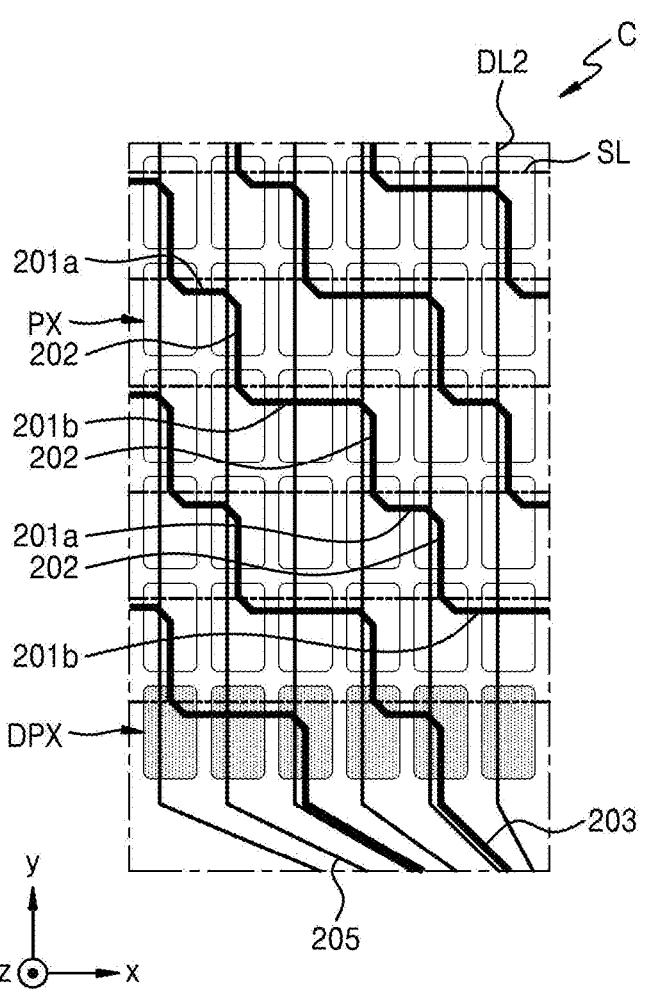
FIG. 20 is a schematic plan view of a portion of a display apparatus according to an embodiment.
Figure 21:
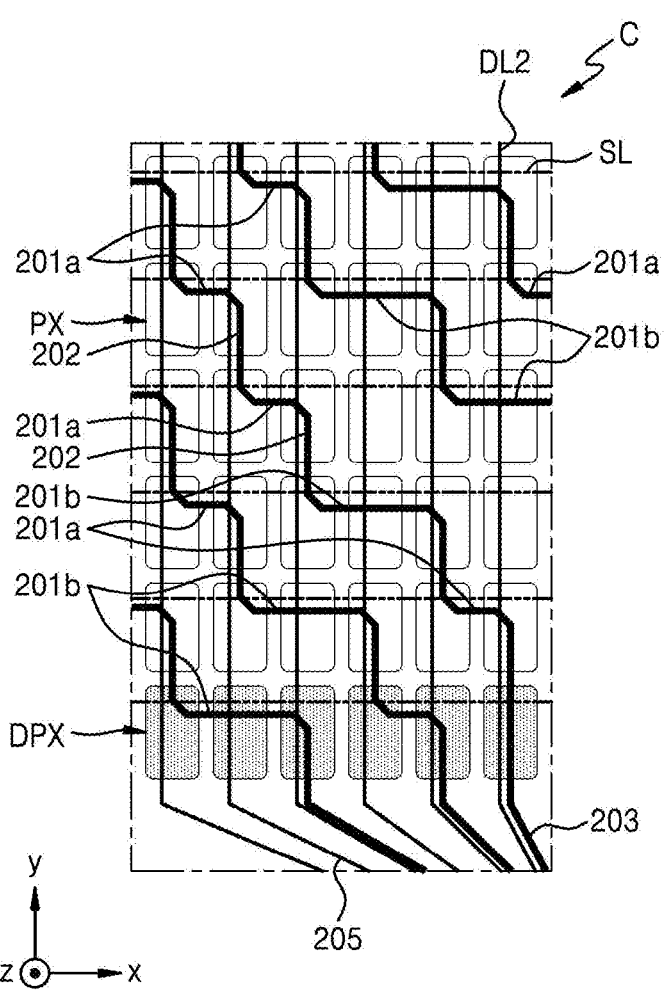
FIG. 21 is a schematic plan view of a portion of a display apparatus according to an embodiment.

As shown in FIG. 20 which is a schematic plan view of a portion of the display apparatus according to an embodiment, the horizontal connection lines may include the first horizontal connection line 201*a* having the first length and the second horizontal connection line 201*b* having the second length alternatively arranged in the second direction (e.g., the x-axis direction). In another embodiment, as shown in FIG. 21 which is a schematic plan view of a portion of the display apparatus according to an embodiment, the lengths in the second direction (e.g., the x-axis direction) of the horizontal connection lines may be randomly arranged. For example, the first connection line may sequentially include the first horizontal connection line 201*a* of the first length, the first horizontal connection line 201*a* of the first length, the second horizontal connection line 201*b* of the second length, and the first horizontal connection line 201*a* of the first length, and another first connection line may sequentially include the first horizontal connection line 201*a* of the first length, the second horizontal connection line 201*b* of the second length, the second horizontal connection line 201*b* of the second length, and the first horizontal connection line 201*a* of the first length. Accordingly, in the first data lines DL1, because the degrees of influences by the scan line SL are different from each other, high-quality images may be displayed as a whole.

Figure 22:
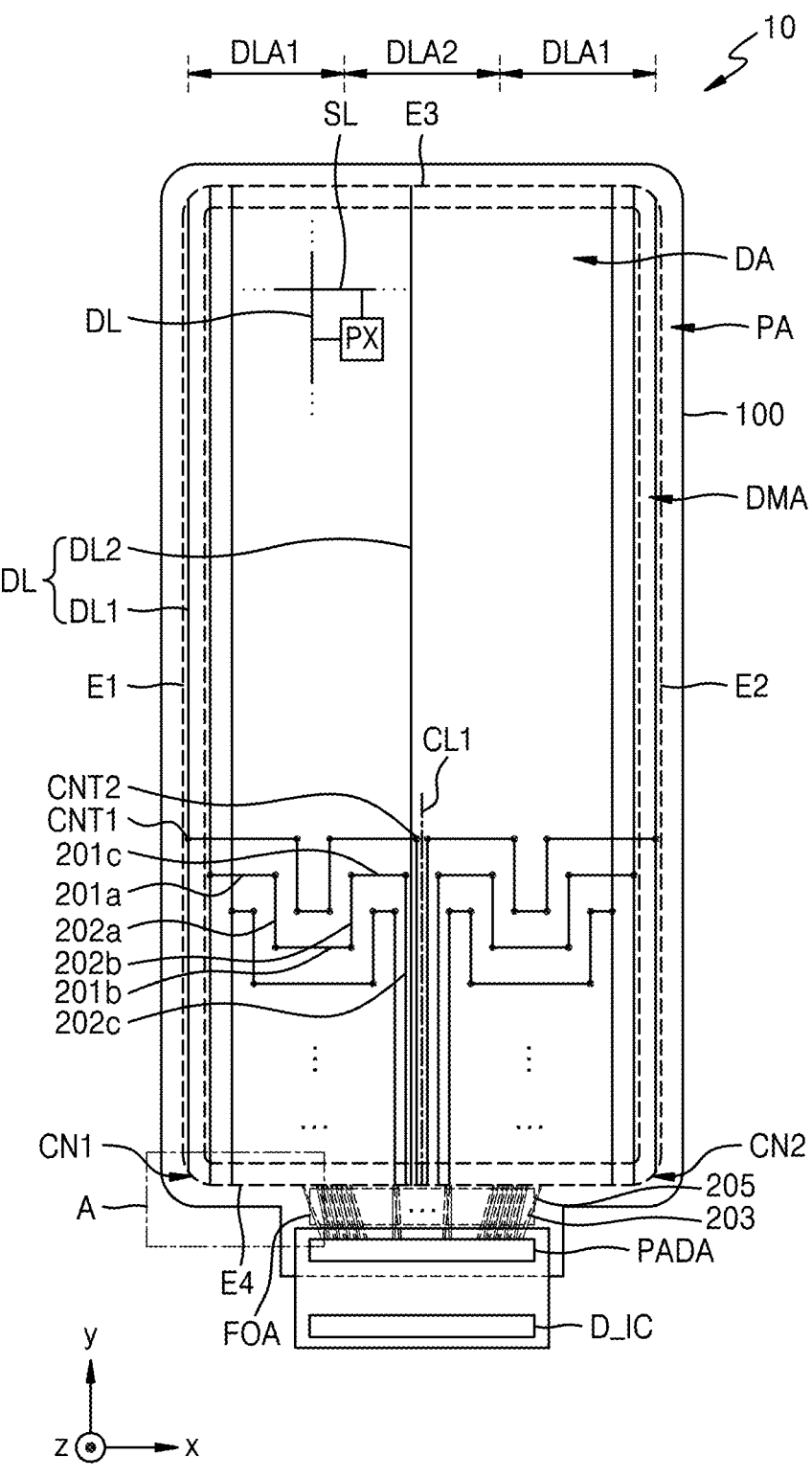
FIG. 22 is a schematic plan view of a display panel of a display apparatus according to an embodiment.

FIG. 22 is a schematic plan view of a display panel 10 of a display apparatus according to an embodiment. The display apparatus according to an embodiment may include the first horizontal connection line 201*a*, the first vertical connection line 202*a*, the second horizontal connection line 201*b*, and the second vertical connection line 202*b* described above with reference to FIG. 1. The display apparatus may also include a third horizontal connection line 201*c* and a third vertical connection line 202*c*.

Unlike the display apparatus according to the above embodiment described with reference to FIG. 1, an end (in the −y direction) of the second vertical connection line 202*b* located in the display area DA may be electrically connected to another end (in the +x direction) of the second horizontal connection line 201*b*, the second vertical connection line 202*b* may extend in the first direction (the y-axis direction), and thus, another end (in the +y direction) of the second vertical connection line 202*b* may be located farther away from the peripheral area PA than the end. An end (in the −x direction) of the third horizontal connection line 201*c* may be located in the display area DA to be electrically connected to the another end (in the +y direction) of the second vertical connection line 202*b*, the third horizontal connection line 201*c* may extend in the second direction (the x-axis direction), and thus, another end (in the +x direction) of the third horizontal connection line 201*c* may be located farther away from the first data line DL1 than the end. An end (in the +y direction) of the third vertical connection line 202*c* may be electrically connected to the another end of the third horizontal connection line 201*c*, the third vertical connection line 202*c* may extend in the first direction (the y-axis direction), and thus, another end (in the −y direction) of the third vertical connection line 202*c* may be located in the direction (the −y direction) of the second horizontal connection line 201*b* with respect to the third horizontal connection line 201*c*. In other words, the another end (in the −y direction) of the third vertical connection line 202*c* may be disposed on a same side as the second horizontal connection line 201*b* with respect to the third horizontal connection line 201*c*. The another end (in the −y direction) of the third vertical connection line 202*c* may be located in the peripheral area PA and connected to the second connection line 203.

Figure 23:
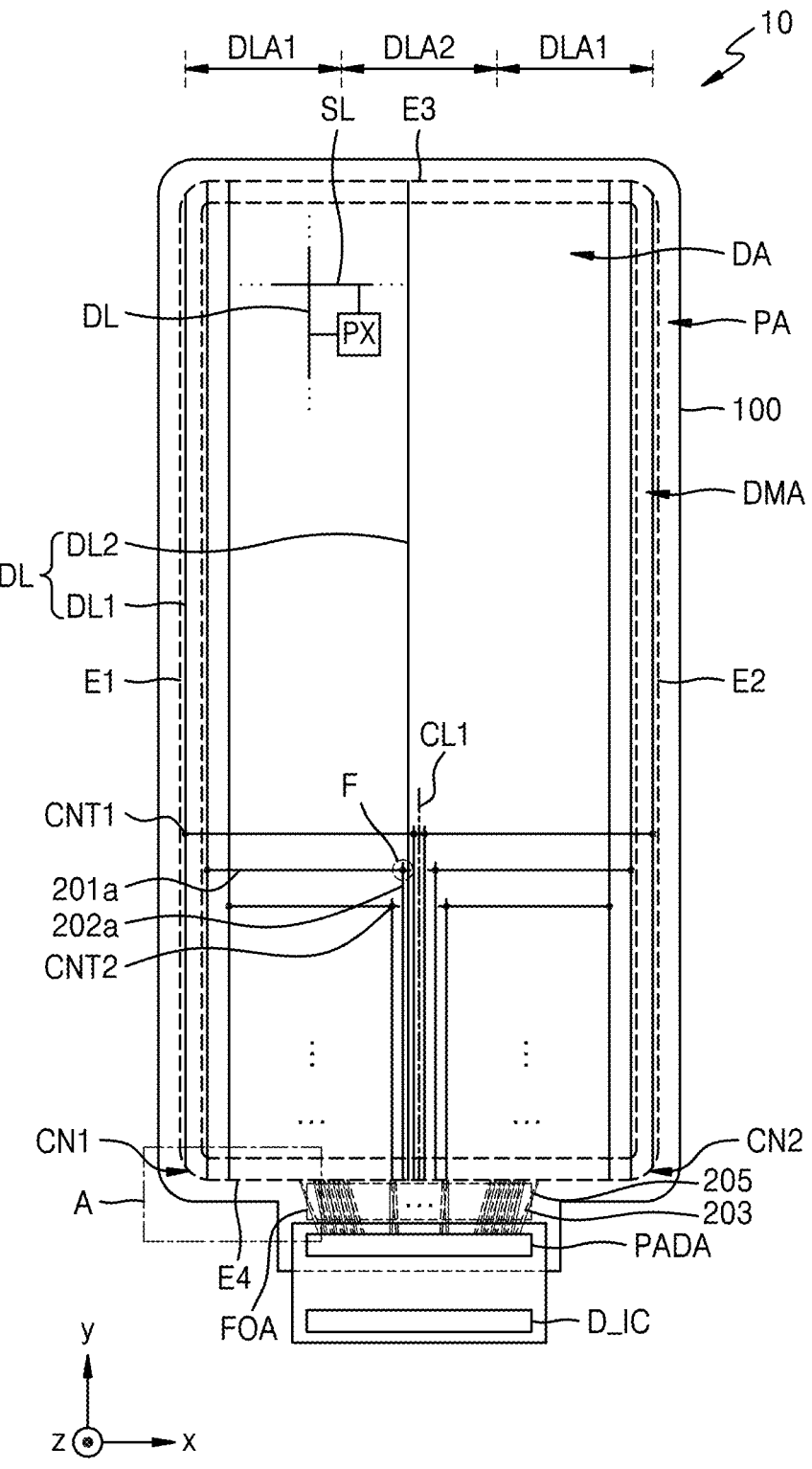
FIG. 23 is a schematic plan view of a display panel of a display apparatus according to an embodiment.
Figure 24:
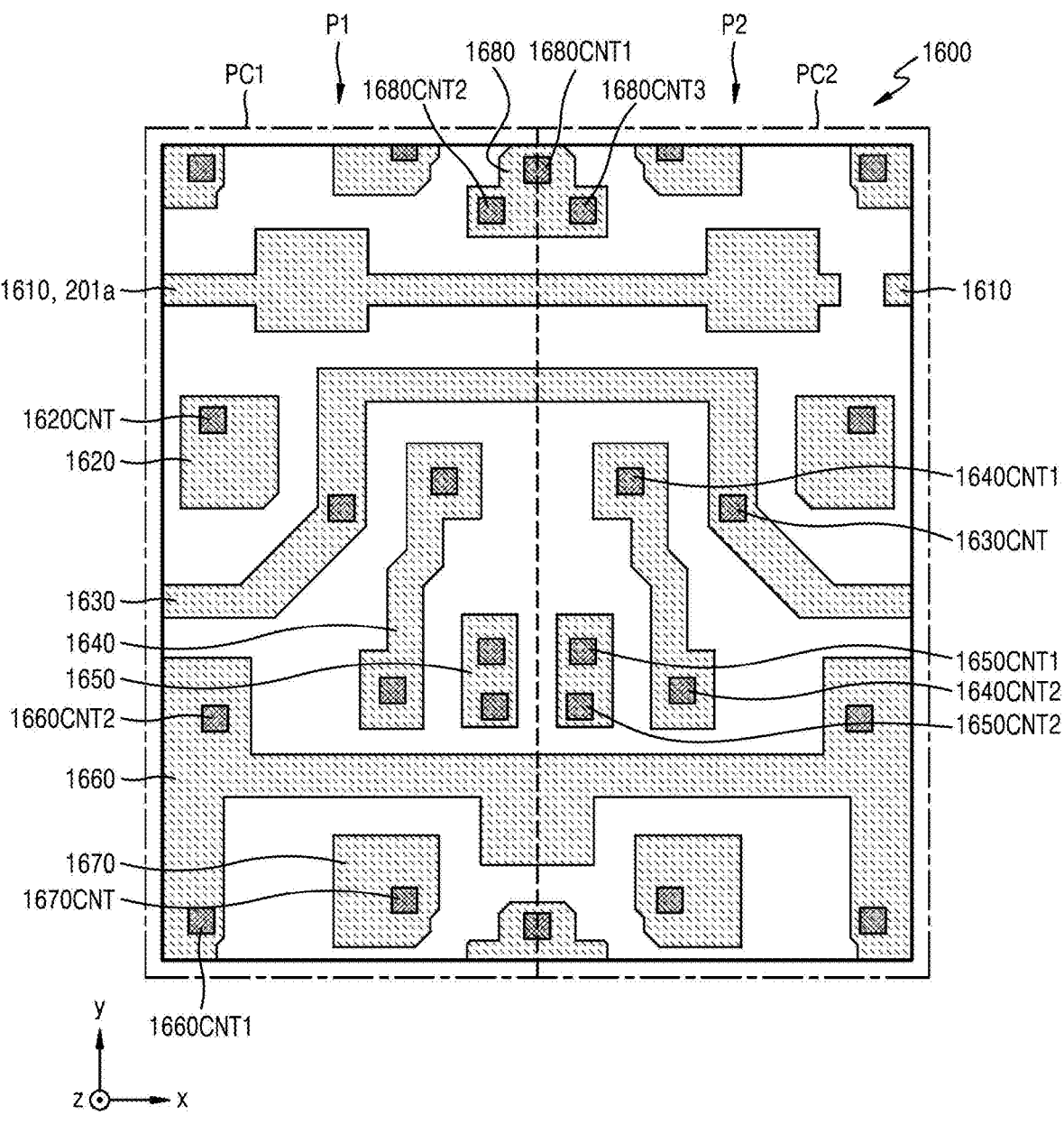
FIGS. 24 and 25 are schematic plan views of some layers in region F of FIG. 23.
Figure 25:
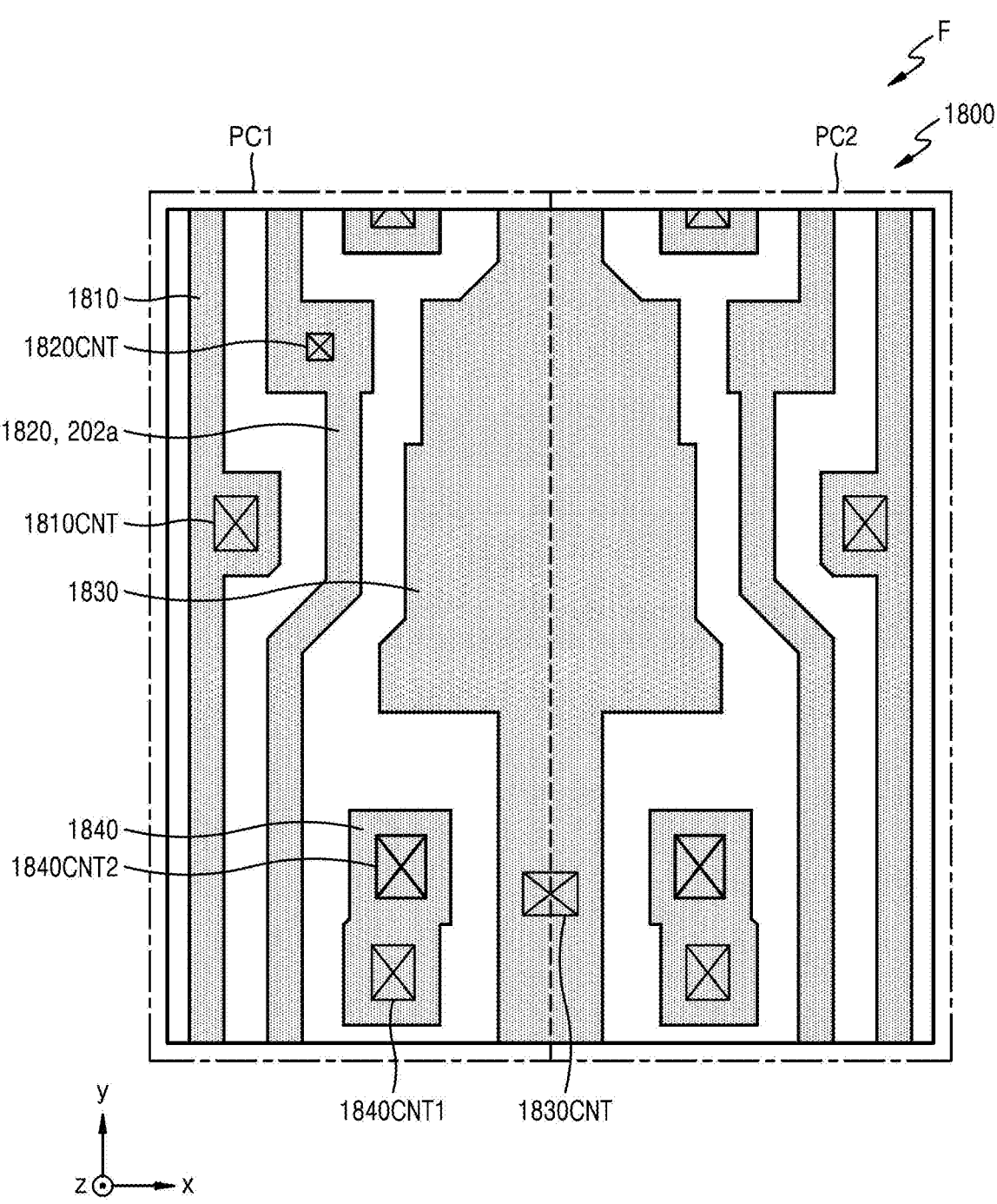

FIG. 23 is a schematic plan view of the display panel 10 of the display apparatus according to an embodiment, and FIGS. 24 and 25 are schematic plan views of some layers in region F of FIG. 23.

As shown in FIG. 23, the first connection line 201*a* and 202*a* connecting the first data line DL1 to the second connection line 203 may include the first horizontal connection line 201*a* extending in the second direction (the x-axis direction) and the first vertical connection line 202*a* extending in the first direction (the y-axis direction). As shown in FIG. 24, the horizontal connection line 1610 extending in the second direction (the x-axis direction) may have a discontinuous point, and a portion located on a side (in the −x direction) of the discontinuous point may serve as the first horizontal connection line 201*a*. The discontinuous point of the horizontal connection line 1610 may be located not in the vicinity of the point corresponding to the contact hole 1820CNT of the vertical connection line 1820 shown in FIG. 25, but may be located in the +x direction of the point.

This is the same for the vertical connection line 1820 as shown in FIG. 25. The vertical connection line 1820 may not be discontinuous in the −y direction from the contact hole 1820CNT of the vertical connection line 1820 but may be discontinuous in a pixel (not shown in FIG. 25) adjacent to the pixel shown in FIG. 25 in the +y direction. Accordingly, as shown in region F of FIG. 23, the first horizontal connection line 201*a* and the first vertical connection line 202*a* may present past the second contact hole CNT2 through which the first horizontal connection line 201*a* is electrically connected to the first vertical connection line 202*a*.

According to an embodiment, a display apparatus which has a reduced peripheral area and displays high-quality images may be implemented. However, the scope of the disclosure is not limited by this effect.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:
   a substrate including a display area and a peripheral area outside the display area;
   a data line arranged in the display area and extending in a first direction;
   a first horizontal connection line connected to the data line in the display area and extending in a second direction intersecting the first direction;

a first vertical connection line arranged in the display area, extending in the first direction, and having an end electrically connected to the first horizontal connection line and another end disposed closer to the peripheral area than the end of the first vertical connection line electrically connected to the first horizontal connection line; and a second horizontal connection line arranged in the display area, extending in the second direction, and having an end electrically connected to the another end of the first vertical connection line and another end disposed farther from the data line than the end of the second horizontal connection line electrically connected to the another end of the first vertical connection line.

2. The display apparatus of claim 1, further comprising: a second vertical connection line having an end electrically connected to the another end of the second horizontal connection line and another end disposed such that the second horizontal connection line is disposed between the another end of the second vertical connection line and the first horizontal connection line.

3. The display apparatus of claim 2, wherein the another end of the second vertical connection line is disposed in the peripheral area.

4. The display apparatus of claim 1, further comprising: a second vertical connection line extending in the first direction and having an end electrically connected to the another end of the second horizontal connection line and another end disposed farther from the peripheral area than the end of the second vertical connection line electrically connected to the another end of the second horizontal connection line.

5. The display apparatus of claim 4, further comprising: a third horizontal connection line arranged in the display area, extending in the second direction, and having an end electrically connected to the another end of the second vertical connection line and another end disposed farther from the data line than the end of the third horizontal connection line electrically connected to the another end of the second vertical connection line.

6. The display apparatus of claim 5, further comprising: a third vertical connection line extending in the first direction and having an end electrically connected to the another end of the third horizontal connection line and another end disposed on a same side as the second horizontal connection line with respect to the third horizontal connection line.

7. The display apparatus of claim 6, wherein the another end of the third vertical connection line is disposed in the peripheral area.

8. The display apparatus of claim 1, wherein the data line and the first horizontal connection line are disposed on different layers.

9. The display apparatus of claim 1, wherein the first horizontal connection line and the second horizontal connection line are disposed on a same layer.

10. The display apparatus of claim 1, further comprising: a plurality of scan lines extending in the second direction.

11. A display apparatus comprising:
a substrate including a display area and a peripheral area outside the display area;
a data line arranged in the display area and extending in a first direction; and
a connection line having an end connected to the data line in the display area and another end disposed in the peripheral area, and including a plurality of horizontal connection lines extending in a second direction intersecting the first direction and a plurality of vertical connection lines extending in the first direction,
wherein a first length in the second direction of one of the plurality of horizontal connection lines and a second length in the second direction of another one of the plurality of horizontal connection lines are different.

12. The display apparatus of claim 11, wherein a distance in the first direction from a portion of the peripheral area in which the another end of the connection line is disposed to one of the plurality of horizontal connection lines that is connected to the data line is greater than distances in the first direction from the portion of the peripheral area to others of the plurality of horizontal connection lines.

13. The display apparatus of claim 11, wherein distances in the first direction from a portion of the peripheral area in which the another end of the connection line is disposed to the plurality of horizontal connection lines decrease toward a center of the display area in the second direction.

14. The display apparatus of claim 11, wherein lengths of the plurality of horizontal connection lines in the second direction are randomly arranged.

15. The display apparatus of claim 11, wherein
the display area includes a plurality of pixel areas,
the first length corresponds to a width of one of the plurality of pixel areas in the second direction,
n is a natural number greater than 1, and
the second length is n times the first length.

16. The display apparatus of claim 15, wherein n is greater than or equal to 2.

17. The display apparatus of claim 15, wherein the plurality of horizontal connection lines include a first horizontal connection line having the first length and a second horizontal connection line having the second length alternatively arranged in the second direction.

18. The display apparatus of claim 11, wherein the plurality of vertical connection lines electrically connect the plurality of horizontal connection lines.

19. The display apparatus of claim 11, wherein the data line is disposed on a layer which is different from a layer on which the plurality of horizontal connection lines are disposed.

20. The display apparatus of claim 11, further comprising: a plurality of scan lines extending in the second direction.

* * * * *